(12) United States Patent
Aoshima et al.

(10) Patent No.: US 7,007,845 B2
(45) Date of Patent: Mar. 7, 2006

(54) LASER EMITTING MODULE, WINDOW CAP, LASER POINTER, AND LIGHT EMITTING MODULE

(75) Inventors: Masayoshi Aoshima, Miyagi (JP); Eiji Otani, Kanagawa (JP)

(73) Assignee: Sony Corporation, Tokyo (JP)

( * ) Notice: Subject to any disclaimer, the term of this patent is extended or adjusted under 35 U.S.C. 154(b) by 17 days.

(21) Appl. No.: 10/802,243

(22) Filed: Mar. 17, 2004

(65) Prior Publication Data

US 2004/0182929 A1 Sep. 23, 2004

(30) Foreign Application Priority Data

Mar. 18, 2003 (JP) .............................. 2003-074345

(51) Int. Cl.
*G06K 7/14* (2006.01)
(52) U.S. Cl. ...................................... 235/454; 235/455
(58) Field of Classification Search ................... 385/88, 385/90, 37; 250/227.11; 372/97, 45, 46; 235/455, 454, 436, 494, 470

See application file for complete search history.

(56) References Cited

U.S. PATENT DOCUMENTS

| 6,394,665 | B1* | 5/2002 | Hayashi ........................ 385/88 |
| 2001/0054681 | A1* | 12/2001 | Hamada ................. 250/227.11 |
| 2002/0136254 | A1* | 9/2002 | Yoshida et al. ............... 372/45 |
| 2004/0016718 | A1* | 1/2004 | Hwu et al. ..................... 216/24 |
| 2004/0165641 | A1* | 8/2004 | Gamache et al. ............. 372/97 |
| 2005/0100068 | A1* | 5/2005 | Jikutani et al. ............... 372/46 |

* cited by examiner

*Primary Examiner*—Thien M. Le
(74) *Attorney, Agent, or Firm*—Sonnenschein, Nath & Rosenthal LLP

(57) ABSTRACT

A laser emitting module, a window cap thereof, a laser pointer using the same and a light emitting module are provided. A light emitted from a laser diode excites a solid-state laser medium so as to generate lights of different wavelengths, the wavelength of which is converted in a non-linear optical element so as to emit a laser beam of a short wavelength by second harmonic generation. An optical resonator including the solid-state laser medium and the non-linear optical element is supported by a base member. Heat of the laser diode and the optical resonator is dissipated via a heat sink which is in contact with the laser diode and the base member, thereby stabilizing temperatures of respective elements and thus the generation of the laser beam.

8 Claims, 14 Drawing Sheets

LASER EMITTING MODULE, WINDOW CAP, LASER POINTER, AND LIGHT EMITTING MODULE

CROSS REFERENCES TO RELATED APPLICATIONS

The present invention claims priority to its priority document No. 2003-074345 filed in the Japanese Patent Office on Mar. 18, 2003, the entire contents of which being incorporated by reference herein.

BACKGROUND OF THE INVENTION

1. Field of the Invention

The present invention relates to a light emitting module that converts a wavelength of the light emitted from a light emitting element, and more specifically, it relates to a laser emitting module that uses a laser diode, a window cap and a laser pointer using the laser emitting module.

2. Description of Related Art

In order to point a referring portion on a screen during a presentation or the like, a pointer capable of emitting a spot light is used. This type of pointer, as it uses a spot light for pointing the referring portion, has such advantages that it can point out any portion on the screen from a distance, and with easier in handling than a rod-like pointer, as it is provided in a compacter size. In order to explicitly point out an intended portion on the screen irrespective of a distance between the user and the screen, it is preferable that the light emitted from the pointer is non-divergent and illuminates only a limited area. Accordingly, use of a laser beam emitted from a semiconductor laser is preferable.

A semiconductor laser used in a typical laser pointer is mainly of a red light emitting laser diode, and in many cases, red color light close to infrared is used. Its relative visibility factor is low. Thus, in order to improve its visibility, an output level of emission thereof must be increased. On the other hand, as it is likely to be concentrated on a very small area, it has been desired for its output to be limited within a safe level at which no injury would occurs to human body even if the laser beam happens to directly enters human eyes. For laser beams having wavelengths in a range from 400 nm to 700 nm, according to the "Laser Beam Injury Prevention Guidelines", its output is desired to be limited below 1 mW.

If the output is limited below 1 mW, because of the low relative visibility for the laser beam emitted from the red light laser diode, it becomes difficult for human eyes to discern the indicated position which is being illuminated by the pointer during presentation using a projector. Accordingly, as an alternative laser pointer using a laser beam in a range of wavelengths which can provide a higher relative visibility factor than the red light, another type of laser pointer has been proposed. For example, Japanese Patent Application Publication H06-326380 discloses an optical resonator including a solid state laser medium which is excited by a laser emitted from a laser diode and a non-linear optical element which converts a wavelength of light generated by excitation of the solid state laser medium, which are sandwiched between dichroic coats, for outputting a laser beam having a wavelength shorter than red light.

SUMMARY OF THE INVENTION

However, in this technology for converting the wavelength of a semiconductor laser to a shorter wavelength, there are various shortcomings as will be described below. For example, because that an efficiency in the wavelength conversion in the optical resonator including a laser diode, a solid-state laser medium and a non-linear optical element is dependent on temperature. Accordingly, a temperature control device is required, thereby preventing to reduce the size and the cost of a laser pointer. The output of laser beam substantially changes and becomes unstable when its operating temperature changes because of temperature dependency in the wavelength conversion, thereby causing deterioration of the visibility of a region spot-lighted while the laser beam the brightness of which varies unstably. Further, a risk of injury to human body may increase due to an unexpected increase in the output of laser beam due to such a temperature change.

Further, in the technology disclosed in the above-mentioned Japanese Patent Application Publication H06-326380, a laser diode, optical resonator, battery drive circuit and the like are arranged discretely in single casing. Accordingly, a manufacture of such a laser pointer has to handle all elements and components thereof discretely, thereby causing an increase of risk for having dust adhered on respective elements and components during their assembly. Accordingly, a failure rate of products may be increase and service life thereof may be decreased. Further, because of a large number of the components, the number of assembling steps is increased. Further, as most of the components being optical parts, a precision alignment and careful assembly work are required.

The present invention is contemplated in view of the shortcomings associated with the above described related art. It is desirable to provide a laser emitting module capable of emitting a laser beam with a stable output power, a window cap therefor, a laser pointer using the laser emitting module, and/or, a light emitting module.

A laser emitting module according to an embodiment of the present invention includes: a resonator including a solid-state laser medium, a non-linear optical element for converting a wavelength of light emitted from the solid-state laser medium, and a pair of resonance reflectors disposed in such a way that the solid-state laser medium and the non-linear optical element are positioned in between the resonance reflectors for reciprocating the light therebetween; a laser diode for emitting a light for exciting the solid-state laser medium; and a window cap having a window section for outputting a light emitted from the resonator therethrough and accommodating the resonator and the laser diode.

By accommodating a set of elements and components for the laser emission within this window cap, dust may be prevented from attaching to the laser diode and the resonator. Accordingly, handling of the laser emitting module when mounting the same on electronic equipment is facilitated, and further, an improvement in the reliability and the service life of the laser emitting module is achieved. Still further, by attaching an airtight material which transmits light to the window section so as to ensure the inside the window cap to be maintained airtight, the dust-proof effect may be further enhanced.

Further, by provisions of a base member that supports the resonator, and a heat sink that is disposed in contact with the base member and the laser diode, ambient temperatures of the laser diode and the resonator may be maintained approximately at the same level. Because of dissipation of heat generated in the laser diode and the resonator via the heat sink, advantageously, constant and stable temperature environment may easily be maintained for the laser diode and the resonator, thereby minimizing changes in the wavelengths of the laser beam due to their temperature changes, so that an efficient laser emission may be achieved.

By provision of an optical filter to the laser emitting module for selection of a wavelength of the light emitted from the resonator, it is enabled to cut off other laser beams having wavelengths that are not converted in the resonator, and to thereby improve emission performance of the laser emitting module. This optical filter may be attached to the window section so as to maintain the inside of the window cap airtight and enhance the dust-proof effect.

Further, by provisions of a split reflector for reflecting a part of the light emitted from the resonator and a received photo detector for detecting the light reflected by the split reflector within the laser emitting module, it becomes possible to measure an intensity of the split light, and accordingly to control an intensity of the laser beam to be emitted from the module by driving the laser diode in accordance with the intensity of the split light having been measured. In this case, by use of a surface of the optical filter, which is mounted for selection of the wavelength of the light emitted from the module, as the split reflector, the number of components constituting the module may be reduced.

The received photo detector may include a photodiode for converting a received light into an electrical signal in accordance with its intensity, and a second optical filter that is disposed in front of a receiving surface of the photodiode for selecting a wavelength of the light to be received by the photodiode. Alternatively, the received photo detector may include a light selection layer which allows only a specific light having a specific wavelength to pass through. The light selection layer may be formed on the photodiode which converts the received light into the electric signal according to its intensity.

By arranging the received photo detector to be disposed in a backward direction of the laser diode with respect to the main direction of progression of the light from the resonator, a compacter module may be achieved. In this case, if a reflection plane is provided for further reflecting the light reflected from the split reflector section toward the received photo detector, a more flexibility in the arrangement of the received photo detector may be obtained.

Further, the module may also be arranged in such a way that a plane of the window cap having the window section is formed to be an oblique open window plane which is non-perpendicular relative to the main direction of progression of the light emitted from the resonator, that a part of the side plane of the window cap forms an oblique side plane which is non-parallel to the main direction of progression of the light emitted from the resonator, that the split reflector section is formed on the oblique open window section, and that the reflection plane is formed on the oblique side plane, thereby making it possible to make a smaller module.

A laser emitting module according to an embodiment of the present invention includes: a resonator including a solid-state laser medium, a non-linear optical element for converting a wavelength of the light emitted from the solid-state laser medium, a pair of resonance reflectors sandwiching the solid-state laser medium and the non-linear optical element for reciprocating the light therebetween; a laser diode for emitting a light for exciting the solid-state laser medium; a base member for supporting the resonator; and a heat sink that is disposed in contact with the laser diode and the base member.

By provisions of a base member supporting the resonator, and a heat sink disposed in contact with the laser diode and the base member, both temperature environments for the laser diode and the resonator may be maintained approximately at the same level. Further, as the heat sink dissipates heat generated in the laser diode and the resonator outside the module, it becomes easier to maintain the temperature environments for the laser diode and the resonator at constant levels, thereby enabling to suppress changes in the wavelength of light due to a temperature change, and to achieve an efficient laser emission.

In order to ensure an efficient cooling of the laser diode and the resonator, the base member and the heat sink may be formed as a single unit. It may also be arranged such that the resonator and the base member are jointed with a silver paste, that the base member and the heat sink are jointed with a silver paste, and/or that the heat sink is exposed outside a surface of the laser emitting module.

A window cap according to an embodiment of the present invention is a window cap for accommodating a laser oscillation device for emitting a laser beam. In the window cap, a window section is formed for outputting a laser beam, a plane in which the window section is formed forms an obliquely open window section which is non-perpendicular with respect to a main direction of progression of the laser beam, and a part of a side plane of the window cap forms an oblique side plane which is non-parallel with respect to the main direction of progression of the laser-beam.

By provisions of the obliquely open window plane and the oblique side plane, it is facilitated to accommodate elements and components for splitting and reflecting a part of the laser beam and receiving the part of the laser beam on a received photo detector. Further, by forming a reflecting plane on an inner surface of the oblique side plane for reflecting the light, the number of components to be accommodated within the module may be reduced.

A laser pointer according to an embodiment of the present invention includes: a resonator including a solid-state laser medium, a non-linear optical element for converting a wavelength of the light emitted from the solid-state laser medium, and a pair of resonance reflectors sandwiching the solid-state laser medium and the non-linear optical element for reciprocating the light therebetween; a laser diode for emitting a light for exciting the solid-state laser medium; a window cap having a window section through which the light emitted from the resonator is outputted, for accommodating the resonator and the laser diode therein; an optical filter for selecting a wavelength of an output light emitted from the resonator; and a pair of convex and concave lenses for expanding and collimating the light emitted from the window section into parallel rays of light.

By use of the pair of the concave and convex lens, the laser beam emitted from the window of the window cap may be expanded and collimated to parallel rays of light, so that a compact laser pointer featuring an enhanced visibility may be obtained.

Further, the laser pointer according to the embodiment of the present invention may further include a driver circuit connected to the laser diode for controlling light emission of the laser diode, and the driver circuit may include an automatic current control circuit. Alternatively, it may also be arranged such that a split reflector for reflecting a part of the light emitted from the resonator and a received photo detector for detecting a light reflected from the split reflector are accommodated within the window cap, and that a driver circuit connected to the laser diode is included as well for controlling the laser emission of the laser diode in accordance with an intensity of the light detected by the received photo detector. By controlling an output from the laser diode so as to control the light emission from the resonator, it allows continuous generation of a laser beam complying with an applicable regulation.

A laser pointer according to an embodiment of the present invention includes: a resonator including a solid-state laser medium, a non-linear optical element for converting a wavelength of the light emitted from the solid-state laser medium, and a pair of resonance reflectors sandwiching the solid-state laser medium and the non-linear optical element for reciprocating the light therebetween; a laser diode for emitting light for exciting the solid-state laser medium; a base member for supporting the resonator; a heat sink disposed in contact with the laser diode and the base member; an optical filter for selecting a wavelength of the light emitted from the resonator; and a pair of convex and concave lenses for expanding and collimating the light emitted through the optical filter into parallel rays of light.

By provisions of the base member on which the resonator is mounted and the heat sink disposed in contact with the laser diode and the base member, it becomes possible to maintain both temperature environments for the laser diode and the resonator at a same level. Further, as the heat sink efficiently dissipates heats generated in the laser diode and the resonator, both the temperature environments for the laser diode and the resonator are facilitated to be maintained substantially constant, thereby enabling to suppress changes in the wavelength of an output light due to a temperature change, and to thereby maintain an efficient laser beam emission.

A light emitting module according to an embodiment of the present invention includes: a light emitting element; an optical wavelength conversion element for converting a wavelength of the light emitted from the light emitting element; a base member for supporting the optical wavelength conversion element; and a heat sink disposed in contact with the light emitting element and the base member.

As hereinabove described, a group of elements for emitting a laser beam is accommodated in the window cap, and the laser emitting module is hermetically sealed therein, thereby ensuring dust-proof of the laser diode and the optical resonator. Accordingly, substantially facilitating handling of the laser emitting module when it is mounted into electronic equipment as well as improving the reliability and service life of the laser emitting module.

Further, by contacting the base member supporting the optical resonator and the laser diode with the heat sink, ambient temperatures of the laser diode and the optical resonator may be maintained approximately at the same level. Further, because the heat sink dissipates heat generated in the laser diode and the optical resonator, it is facilitated to maintain constant ambient temperatures for the laser diode and the optical resonator, thereby suppressing changes in the wavelength of an output light resulting from changes in the ambient temperatures, and enabling to achieve an efficient emission of the laser beam.

By provision of the optical filter on the laser emitting module for selecting the wavelength of an output light emitted from the optical resonator, unwanted laser beams having wavelengths other than that converted in the resonator are cut off, thereby improving the laser emission characteristics of the laser emitting module.

Further, by arranging such that a part of the light emitted from the optical resonator is split and reflected by the optical filter for detection and measurement by the photodiode of its intensity of the split light, it is enabled to control an intensity of an output laser beam to be emitted from the module.

Still further, by arranging such that an angle between the main direction of progression of the light and the oblique window plane of the window cap is adjusted not to allow the split reflected light from the optical filter to return to the optical resonator, it becomes possible to prevent the occurrence of the multi-reflection between the optical filter and the optical resonator, and to thereby limiting a spot light of the laser beam emitted from the window section to be a single convergence point.

BRIEF DESCRIPTION OF DRAWINGS

The above and other objects, features and advantages of the present invention will become more apparent from the following description of the presently preferred exemplary embodiment of the invention taken in conjunction with the accompanying drawings, in which.

DETAILED DESCRIPTION OF EMBODIMENTS

First Embodiment

As an application of a light emitting module according to an embodiment of the present invention, a laser emitting module, a window cap thereof and a laser pointer using the same will be described in detail with reference to the accompanying drawings. It should, however, be noted that the present invention is not limited thereto, and many other modifications and changes thereof may be considered within the scope of the present invention.

Figure 1:
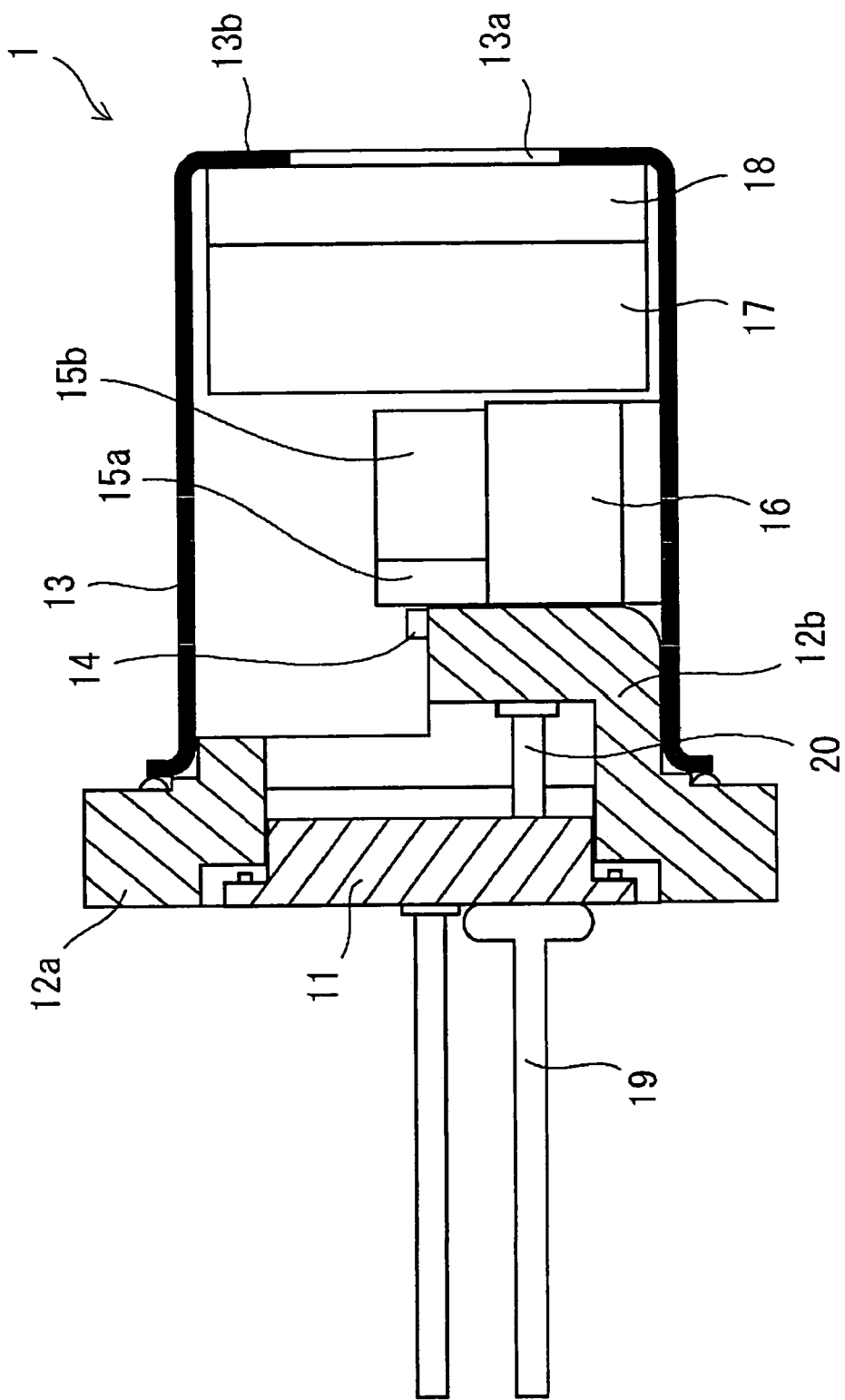
FIG. 1 is a cross-sectional view showing a schematic configuration of a laser emitting module according to a first embodiment of the present invention.
Figure 2:
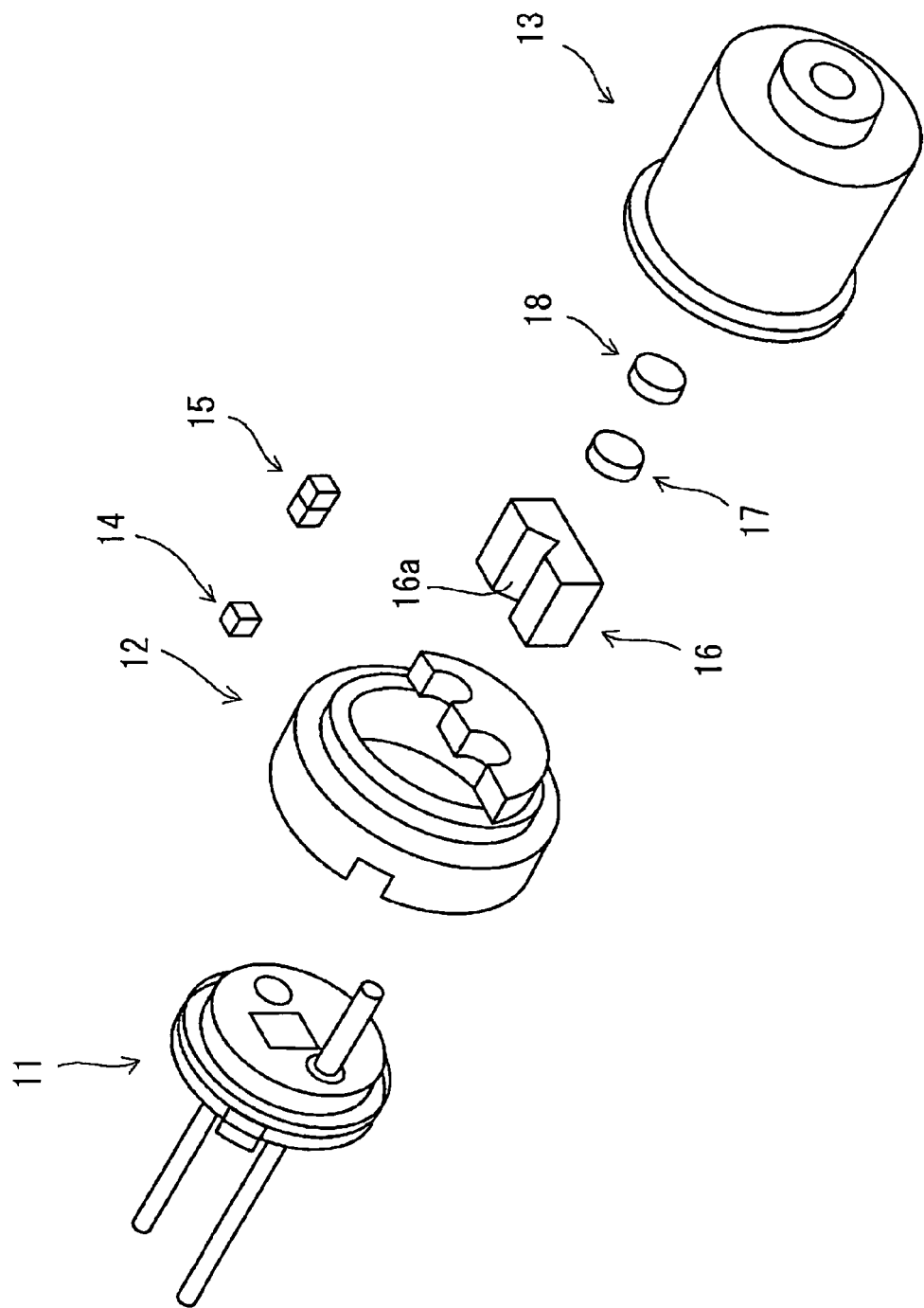
FIG. 2 is an exploded perspective view of the laser emitting module according to the first embodiment of the present invention.

By referring to FIGS. 1 and 2, a configuration of a laser emitting module according to the present embodiment will be described. FIG. 1 is a schematic cross-sectional view, and FIG. 2 is an exploded perspective view thereof. A laser emitting module 1 has an outer shape formed from a header 11 to which a laser diode is to be attached, a heat sink 12 for dissipating heat to the outside, and a window cap 13 for protecting inside the module. Within the window cap 13, there are accommodated a laser diode 14 for emitting a light for exciting a solid-state laser medium, an optical resonator 15 for converting a wavelength of laser beam, a base member 16 for securing the optical resonator 15 thereon, and an optical filter 17 for selecting a wavelength of an output laser beam to be emitted to the outside, and a window glass 18 attached for securing air tightness.

The header 11 is a disk-shaped member having an outer shape such that two disks having a different diameter are put together. A disk with the smaller diameter thereof is disposed facing the inside of the laser emitting module 1 and coupled, for example, by fitting into the heat sink 12 disposed adjacent thereto. Contact portions between the heat sink 12 and the header 11 are joined airtight so as to prevent air flow through the contact portions. An external terminal 19 and an internal terminal 20 are formed through the header 11, and the external terminal 19 and the internal terminal 20 are electrically connected in order to be able to supply a current from the outside into the laser emitting module.

The heat sink 12 is a member which has a flange-shaped portion 12a and a seating portion 12b formed as a single unit. The heat sink 12 is arranged in contact with the base member 16 which holds the optical resonator 16 thereon, and the laser diode 14 so as to conduct and dissipate heat generated in the laser diode 14 and the optical resonator 15 to the outside, and accordingly is made of a metal or the like having a high thermal conductivity, such as copper.

An outer diameter of the flange-shaped portion 12a of the heat sink defines a maximum diameter of the laser emitting module 1, and an outer peripheral surface thereof is exposed from the surface of the module. An inner diameter of the flange-shaped portion 12a corresponds to a size for allowing the header 11 to fit in, so that both are joined, for example, by fitting with their contact portions secured airtight. The seating portion 12b of the heat sink which has a shape of a half-cylinder obtained by splitting a cylinder along its center axis is formed so as to cover a half bottom portion of the flange-shaped portion 12a as depicted in FIG. 1. On the seating portion 12b, a laser diode 14 is mounted and held at a position along a center axis of the window cap 13. Further, the seating portion 12b is encased within the window cap 13 when the window cap 13 is attached to the heat sink 12.

The window cap 13 is a member of the module having approximately a cylindrical shape, with one end thereof facing the heat sink 12 being open, and the other end thereof opposite to the heat sink 12 having a window plane 13b in a center region thereof a window section 13a being provided. A side wall diameter of the window cap 13 has a size that allows the seating portion 12b of the heat sink 12 to fit in, and has enough space to accommodate the optical resonator 15, the base member 16, an optical filter 17 and a window glass 18 therein as will be described later.

The open side of the window cap 13 is joined with the flange-shaped portion 12a of the heat sink 12 in such a manner to maintain airtight at their contact portions. Although various methods for joining therebetween may be applicable, the window cap 13 and the heat sink 12 may be joined, for example, by applying nickel plating to the surface of the heat sink 12 and using a predetermined welding to thereby provide hermetic sealing.

The window section (port) 13a is an aperture provided in the window plane formed on the other side of the heat sink 12, and serves as an output port for outputting a light generated inside the laser emitting module 1. The window section 13a, as it serves as the output port for the laser beam, is formed on a light path of the laser beam to be emitted from the module, and is positioned approximately in the center of the window plane of the window cap 13. Although the shape of the window section 13a is depicted to be approximately a circular aperture in the drawing, it is not limited thereto as long as it allows the laser beam to be output to the outside from the module. Further, the size of the window section 13a may be any size as long as it allows the laser beam to be outputted from the module. Further, as will be described more in detail later, a window glass 18 is attached to the window section 13a to keep airtight.

Because the window cap 13 is provided for protection of respective elements and members accommodated therein, preferably, it has some degree of rigidity that can withstand a mechanical shock or pressure likely to be subjected to during normal handling of electronic parts. Further, as it is coupled to the heat sink 12, preferably it is formed with a material having a high thermal conductivity in order to ensure an efficient dissipation of the heat conducted by the heat sink 12. Still further, in order to define a position for extracting the light generated in the laser emitting module exclusively to the window section 13a, it needs to have a light shielding capability.

The laser diode 14, which is an element that generates a laser beam of a predetermined wavelength when applied with voltage, is a semiconductor laser element, for example, such as a gallium aluminum arsenide (GaAlAs). The semiconductor laser element used in the embodiment of the present invention generates a laser beam of 808 nm wavelength. The laser diode 14 is disposed in contact with the seating portion 12b of the heat sink 12. In this case, the laser diode 14 is disposed in such a way that its emitting surface is disposed to face the window section 13a formed in the window cap 13, and at a position in the vicinity of an edge of the seating portion 12b on the side facing the window section 13a in order to minimize a distance to the optical resonator 15.

Although not indicated in the drawing, the laser diode 14 is electrically connected to an inner terminal 20, and generates a laser beam at 808 nm wavelength in accordance with a voltage applied via an external terminal 19. The laser diode 14 conducts its heat generated during the laser emission to the heat sink 12 so as to be dissipated to the outside the module. Accordingly, a jointing method which ensures a high thermal conductivity between the laser diode 14 and the seating portion 12b of the heat sink 12 is desirable. For example, it is preferable to use solder for jointing.

The optical resonator 15, which is a member used for converting a wavelength of the laser beam emitted from the laser diode 14 so as to emit a laser beam having a different wavelength, has such a structure that a solid-state laser medium 15a and a non-linear optical element 15b are joined together, and are sandwiched between dichroic coatings which reflect a predetermined wavelength of light. The optical resonator 15 is supported by the base member 16, of which the solid-state laser medium 15a is disposed adjacent to the laser diode 14 while the non-linear optical element 15b of which is disposed approximately on the central axis of the window cap 13 on the side facing the window section 13a thereof. In this case, the optical resonator 15 and the laser diode 14 do not make contact with each other but are disposed at a distance of approximately a few $\mu$m.

A mechanism for the optical resonator 15 to convert the wavelength of an incident laser beam and emit a laser beam having a different wavelength is known as second harmonic generation (SHG). In this embodiment according to the present invention, Nd:YVO$_4$ is used as the solid-state laser medium, and potassium titanate phosphate (KTiOPO$_4$, hereinafter referred to as KTP) is used as the non-linear optical element. However, in the present invention, they are not limited thereto, and the optical resonator 15 may be constituted using any other appropriate materials. The laser beam of 808 nm wavelength generated by the laser diode 14 enters the solid-state laser medium 15a to thereby excite the electronic state therein, then to emit a laser beam of 1064 nm from the solid-state laser medium 15a. The laser beam of 1064 nm wavelength emitted from the solid-state laser medium 15a enters the non-linear optical element 15b in which the wavelength of the laser beam is further converted, and finally a laser beam of 532 nm wavelength is emitted from the optical resonator.

Because of a large spread angle of the light emitted from the laser diode 14, an optical radius of the light of 808 nm wavelength emitted from the laser diode 14 expands largely before it reaches the solid-state laser medium 15a, thereby reducing an energy density per unit area. Therefore, it is important that the emitting plane of the laser diode 14 and a front plane of the solid-state laser medium 15a adjacent thereto are placed as close as possible so as to enhance efficiency for exciting the light of 1064 nm wavelength in the solid-state laser medium 15a.

The base member 16 is a member of the module for securing the optical resonator 15 as well as for conducting heat generated in the optical resonator 15. Accordingly, it is preferable that the base member 16 is made of a material having a high thermal conductivity, for example, such as copper. The base member 16, which has a rectangular shape with a groove 16a formed therein, into which the optical resonator 15 is fitted and supported, is disposed in contact with the seating portion 12b of the heat sink 12. Accordingly, it can efficiently conduct the heat generated in the optical resonator 15 to the heat sink 12 as well as juxtapose the laser diode 14 and the optical resonator 15, which are supported by the seating portion 12b, in next to each other.

Further, in order to conduct the heat efficiently from the optical resonator 15 to the base member 16, it is preferable to use adhesive having a high thermal conductivity, for example, such as silver paste for jointing the optical resonator 15 and the base member 16. Also, it is preferable to use the adhesive with a high thermal conductivity, for example, the silver paste for jointing the base member 16 and the heat sink 12. Alternatively, the heat sink 12 and the base member 16 may be made of the same material and formed as a single unit.

An optical filter 17 is a member of the module that absorbs a light of a predetermined wavelength. The optical filter 17 has a disk-shaped appearance, and its outer diameter is approximately the same as an inner diameter of the side wall of the window cap 13. The optical filter 17 is disposed in juxtaposition with the optical resonator 15 and the base member 16 on the side closer to the window section 13a. A material of the optical filter 17 selected according to the embodiment of the invention is such one that efficiently absorbs or reflects the light of 808 nm wavelength emitted from the laser diode 14 and the light of 1064 nm wavelength emitted from the solid-state laser medium 15a, and transmits the light of 532 nm wavelength converted in the non-linear optical element 15b. Because the lights of 808 nm and 1064 nm wavelengths are absorbed in the optical filter 17, an output light emitted from inside the window cap 13 through the window section 13a is limited only to a green laser beam of 532 nm wavelength.

A window glass 18 is a disk-shaped member to be attached to the window section 13a which is an opening formed in the window cap 13 for securing hermetic sealing at the window section 13a. Because that the laser beam converted in the optical resonator 15 has to be emitted through the window section 13a, it is desirable for the window glass 18 to be formed of a material that transmits at least an output light of a wavelength converted in the optical resonator 15. Further, in order to secure air tightness at the window section 13a, the diameter of the window glass 18 is larger than the aperture of the window section 13a, and an inner surface of the window section 13a in the window cap 13 and the window glass 18 are jointed so as to be hermetically sealed therebetween. A material of the window glass 18 may include, for example, a low melting point glass.

The optical filter 17 is required to have a property to absorb a light of a predetermined wavelength, and the window glass 18 is required to have a property to transmit the laser beam obtained by the conversion of the wavelength. Because these properties do not contradict to each other, the optical filter 17 may be used as the window glass 18 as well. In this case, the optical filter 17 is jointed to the plane of the window section 13a of the window cap 13 to hermetically seal the window section 13a therewith and secure air tightness.

When accommodating and arranging respective elements and components within the window cap 13, they are assembled in a clean and dry air, for example, such as in a clean room environment. During assembly, because air tightness between the window section 13a of the window cap 13 and the window glass 18 is secured, air tightness between the window cap 13 and the heat sink 12 is secured, as well as air tightness between the heat sink 12 and the header 11 is secured. Accordingly, inside the laser emitting module 1 is completely air-tight. By hermetically sealing the inside the module with a dry air having a dew point around at −40° C., dust-proof of the laser diode 14 and the optical resonator 15 disposed within the module as well as dew condensation prevention can be achieved. Accordingly, a longer service life, a less failure rate and an improved yield of the laser diode 14 as well as the optical resonator 15 can be achieved, thereby improving the reliability of the laser emitting module 1. An inert gas such as nitrogen may be filled instead of the dry air.

Figure 3:
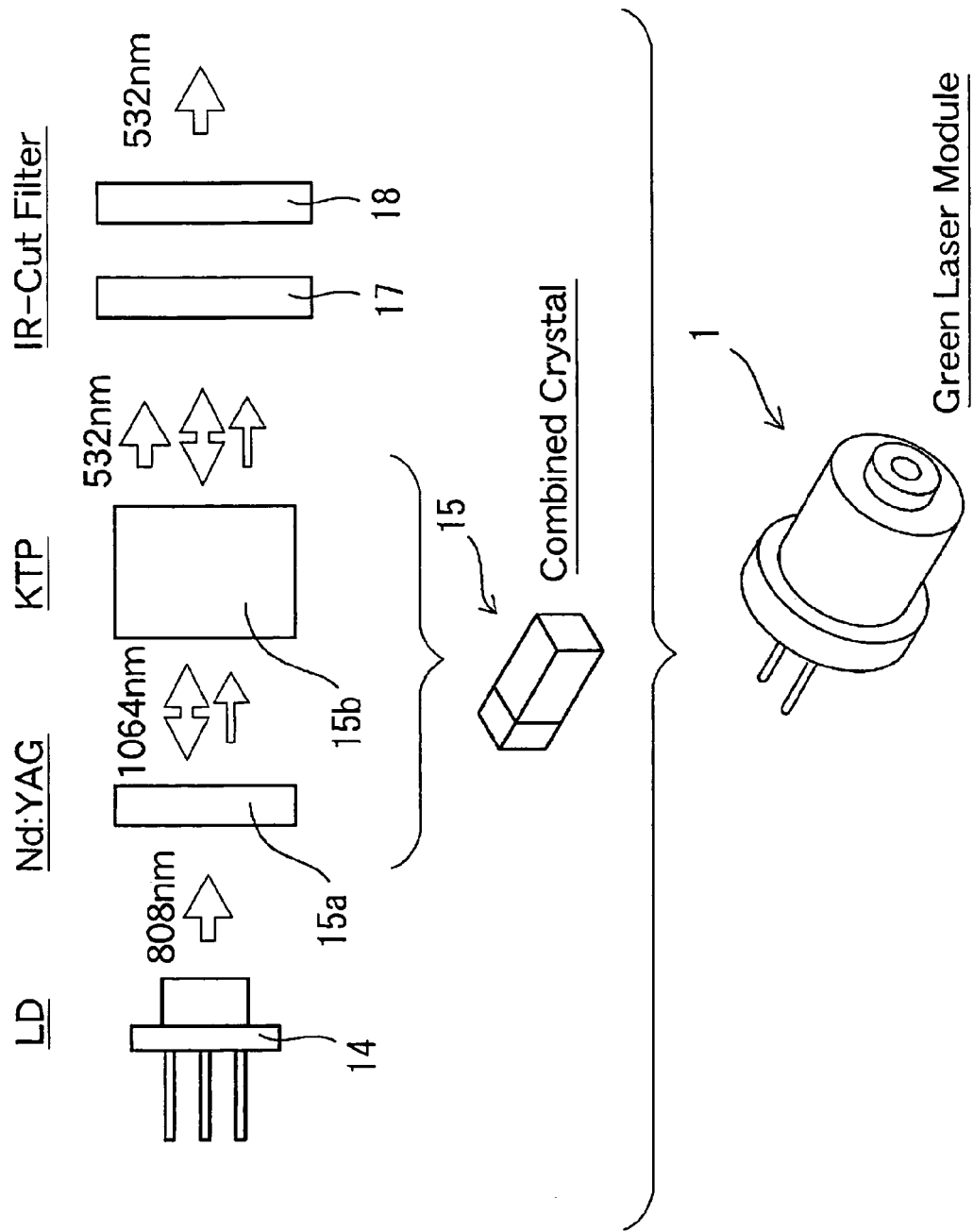
FIG. 3 is a schematic diagram showing conversions of wavelengths of light performed on the basis of the second harmonic generation (SHG) in the laser emitting module according to the first embodiment, with reference to respective wavelengths at respective elements.

FIG. 3 is a schematic diagram showing changes in the wavelengths of light occurring between respective members in the laser emitting module 1 shown in FIGS. 1 and 2. When a laser beam of 808 nm wavelength generated in the laser diode 14 passes through the solid-state laser medium 15a, a laser beam of 1064 nm wavelength is generated. At this time, a portion of the light of 808 nm wavelength from the laser diode 14 also passes therethrough without being converted, thereby allowing two kinds of light of different wavelengths to reach the non-linear optical element 15b. In the non-linear optical element 15b, although a portion of the light of 1064 nm wavelength is converted to a light of 532 nm wavelength, the other portions of the light of 1064 nm wavelength and also the light of 808 nm wavelength, which are not converted, are outputted from the optical resonator 15 as well. By passing three kinds of light with different wavelengths emitted from the optical resonator 15 through the optical filter 17, the lights of 1064 nm and 808 nm wavelengths are absorbed, and only the light of 532 nm wavelength is allowed to output from the laser emitting diode 1.

The light of 532 nm wavelength is recognized as green light to human eyes, and has a higher relative visibility than red laser beam or near infrared laser beam. Accordingly, when the green laser beam is emitted at the same output power as the red color laser beam, a better visibility may be obtained than the red laser beam. Therefore, it is possible to obtain a better visibility even when its output power is reduced in order to minimize the risk of harm to human body.

Further, when converting the wavelengths using SHG as shown in FIG. 3, because emission characteristics and wavelength conversion characteristics of both of the solid-state laser medium 15a and the non-linear optical element 15b depend on its operating ambient temperature, it is desirable that changes in their operating temperatures are kept minimal. For example, in the case where $Nd:YVO_4$ is used as the solid-state laser medium 15a, it is desirable for the wavelength of light to be in a range of 808.6±2.0 nm in order to efficiently excite the solid-state laser medium 15a. However, if the ambient temperature of the laser diode 14 changes by about 10° C., the wavelength of the light emitted therefrom will change about 3 nm. Further, because a crystal of the solid-state laser medium 15a is sliced assuming its operating ambient temperature to be about 25° C., if an operating temperature changes substantially, a light emission efficiency at shorter wavelengths based on the SHG will drop.

In the embodiment of the present invention, as described above with reference to FIG. 1, the laser diode 14 is attached to the heat sink 12 with solder having a high thermal conductivity; the optical resonator 15 is jointed to the base member 16 with adhesive having a high thermal conductivity; and the heat sink 12 and the base member 16 are attached with adhesive having a high thermal conductivity. Further, because that the heat sink 12 and the base member 16 are made of a metal having a high thermal conductivity, and because that the heat sink 12 is exposed outside the surface of the laser emitting module 1, the heat generated in the laser diode 14 and the optical resonator 15 are ensured efficiently to be dissipated externally through the base member 16 and the heat sink 12. Accordingly, in the laser emitting module according to the embodiment of the present invention, it is enabled to stabilize the operating ambient temperatures of the laser diode 14 and the optical resonator 15, thereby ensuring an stable output and an efficient emission of the laser beam of 532 nm wavelength which is outputted at the end.

Figure 4:
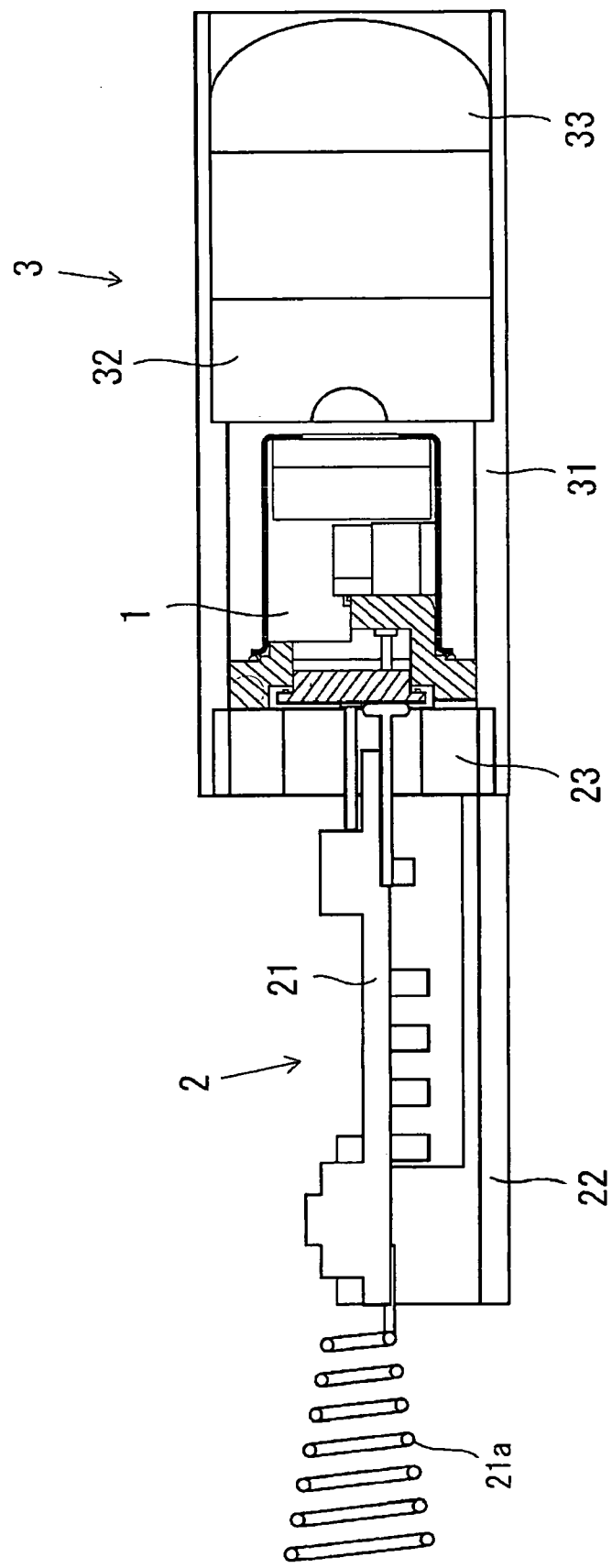
FIG. 4 is a cross-sectional view showing a configuration of a laser pointer using the laser emitting module according to the first embodiment of the invention.
Figure 5:
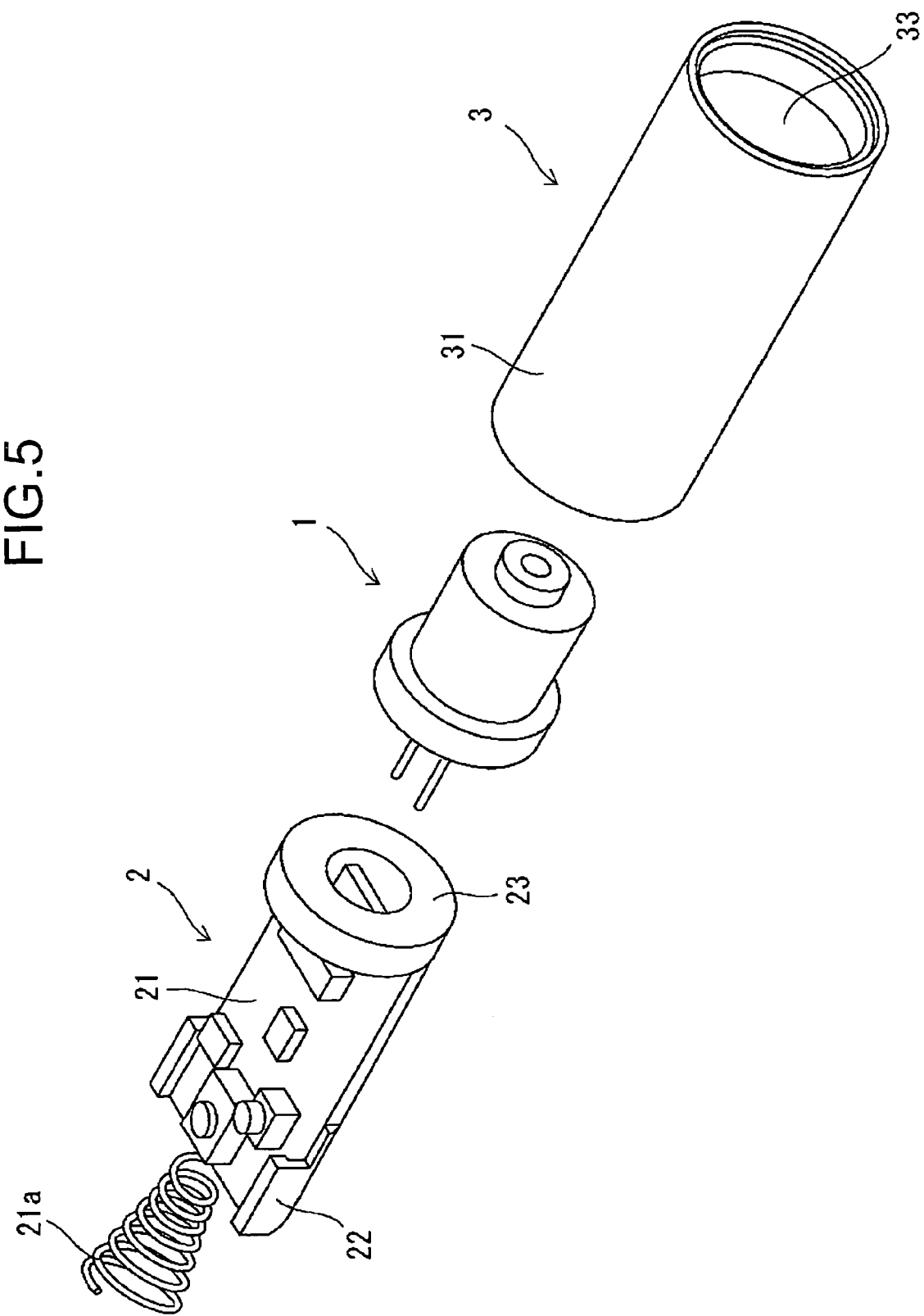
FIG. 5 is an exploded perspective view showing the configuration of the laser pointer using the laser emitting module according to the first embodiment of the invention.

A laser pointer using the above-mentioned laser emitting module 1 will be described in detail by referring to FIGS. 4 to 7. FIG. 4 is a cross-sectional view of the laser pointer, and FIG. 5 is an exploded perspective view thereof. The laser pointer is configured by combining the laser emitting module 1, a driver section 2 and a lens section 3 as shown in FIG. 5.

Figure 6:
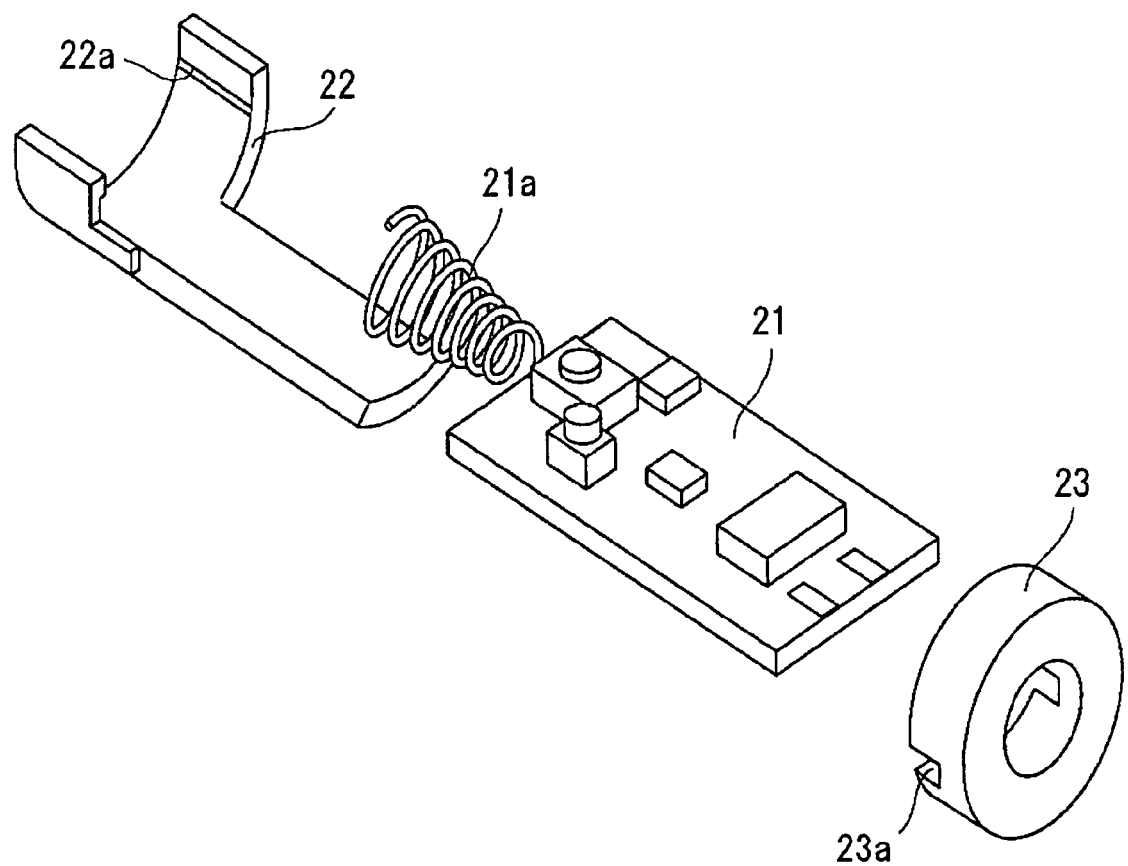
FIG. 6 is an exploded perspective view showing a configuration of a driver section thereof.

The driver section 2 is a member of the laser pointer, which is electrically connected to the laser emitting module 1 and applies a voltage thereto to control light emission therefrom. As shown in FIG. 6, the driver section 2 includes a circuit board 21, a driver support section 22 and a light emitting module support section 23.

The circuit board 21 has a substrate on which electrical circuits are formed, and is electrically connected to the external terminal 19 of the laser emitting module 1. The electrical circuit formed on the circuit board 21 includes, for example, an auto current control (ACC), which adjusts the voltage supplied from the power source in accordance with changes in the output characteristics of the laser emitting module 1, supplies the output thereof to the external terminal 19, and controls an intensity of the light emitted from the laser emitting module 1. Because that the circuit board 21 can control the intensity of the light emitted from the laser emitting module 1, it becomes possible to limit the intensity of the laser beam outputted from the laser pointer to a predetermined level or below so as that the emission of the laser beam at a safer output level, which is harmless to human body, can be maintained. A power supply wiring 21a formed of a spring type conducting material is attached to the circuit board 21. By connecting the power supply wiring 21a to a power source such as a battery or the like, a current is supplied via the power supply wiring 21a to the circuit board 21 for driving the same.

The driver support section 22 is a member that forms an outline of the driver 2 and secures the circuit board 21 and the light emitting module support section 23. The driver support section 22 serves as a casing for supporting the driver by fitting a portion of the substrate of the circuit board 21 with a groove 22a formed in the driver support section 22. The light emitting module support section 23 which secures the driver support section 22 and the circuit board 21 is a member for supporting the laser emitting module 1 and the circuit board 21 while securing electrical connection therebetween. The circuit board 21 is attached to the light emitting module support section 23 by fitting a portion of the substrate of the circuit board 21 with a groove 23a formed in the light emitting module support section 23. Together with the laser emitting module 1 attached to the opposite side of the circuit board 21, the light emitting module supporting section is accommodated in a lens casing 3.

Figure 7:
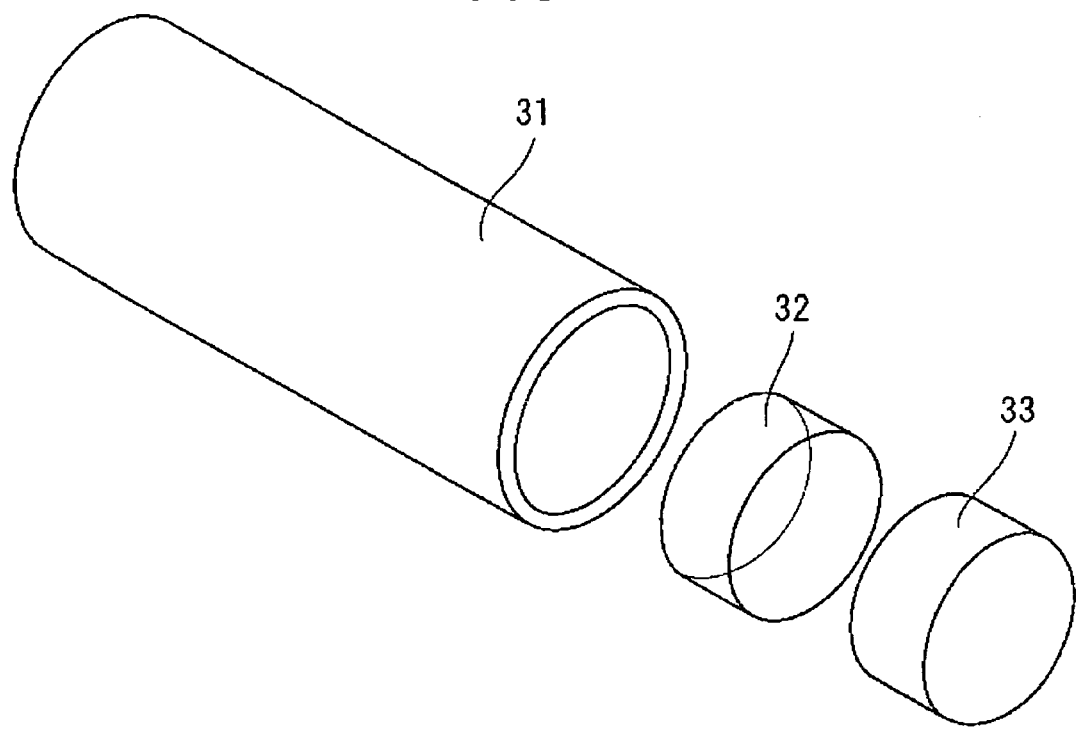
FIG. 7 is an exploded perspective view showing a configuration of a lens section thereof.

The lens section 3 functions as a collimator lens for collimating the laser beam emitted from the laser emitting module 1 into parallel rays of light. The lens section 3 includes a lens holder 31, a concave lens 32 and a convex lens 33 as shown in FIG. 7.

The lens holder 31 is approximately a cylindrically-formed member, and its inner diameter is approximately the same as the diameters of the laser emitting module 1, the light emitting module support section 23, the concave lens 32 and the convex lens 33. In the lens holder 31, there are fixed and disposed the laser emitting module 1, the light emitting module holder 22, the concave lens 32 and the convex lens 33. The concave and convex lenses 32 and 33 are supported in parallel at a predetermined distance.

The lens holder 31 is made of a material having a high thermal conductivity, for example, such as copper, and when securing the laser emitting module 1 within the lens holder 31, the heat sink 12 and the lens holder 31 are jointed with an adhesive having a high thermal conductivity. Accordingly, the heat generated by the laser diode 14 and the optical resonator 15 within the laser emitting module 1 can be conducted via the heat sink 12 to the lens holder 31 and efficiently dissipated therefrom. As described hereinabove, because of the efficient heat dissipation from the laser diode 14 and the optical resonator 15, and accordingly, the stabilized operating temperatures for the laser diode and the optical resonator, it becomes possible to improve the efficiency of the laser beam emission and maintain a stabilized output of the laser beam. Still further, because a stabilized output of the laser can be maintained without use of the complicated control system required for a typical temperature controls, the number of components can be decreased thereby reducing the cost of manufacture.

The concave lens 32 and the convex lens 33 in combination function as a collimator. The concave lens 32 spreads an optical radius of the laser emitted from laser emitting module 1, and the convex lens 33 collimates it to parallel rays of light. Because that an area to be illuminated by the laser beam emitted from the laser emitting module 1 can be expanded as well as its light can be collimated, by use of this laser pointer of the present embodiment it becomes possible to spot-light a remote object as illuminated with a light of a constant radius.

Second Embodiment

A laser emitting module, a window cap thereof, and a laser pointer using the same according to another embodiment of the present invention will be described by referring to the accompanying drawings. The present embodiment of the present invention differs from the present embodiment in that the intensity of a laser beam emitted is measured and its output power is controlled by an auto power control (APC) circuit.

Figure 8:
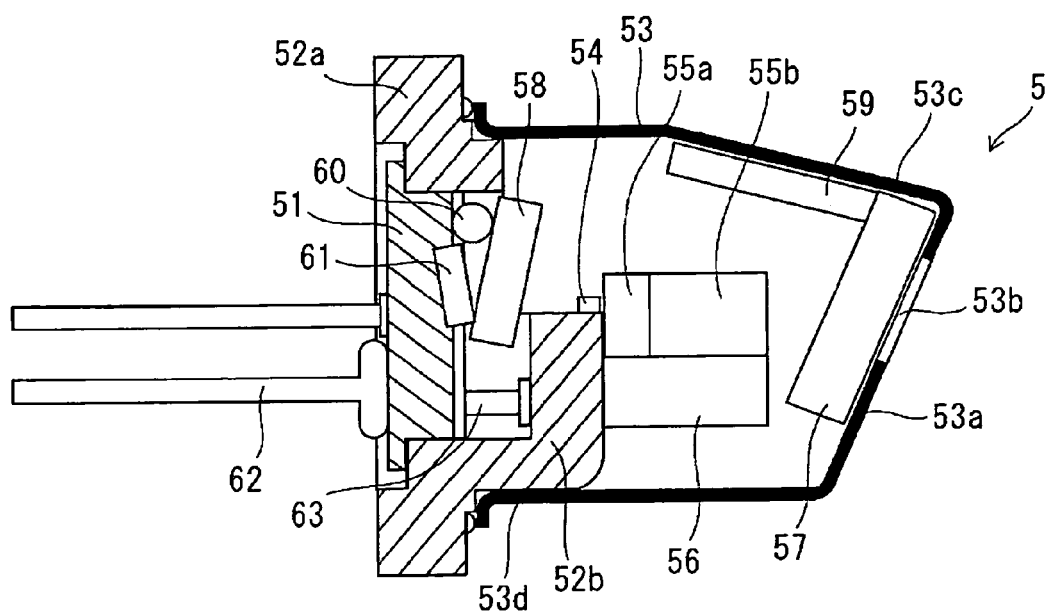
FIG. 8 is a cross-sectional view showing a configuration of a laser emitting module according to a second embodiment of the present invention.
Figure 9:
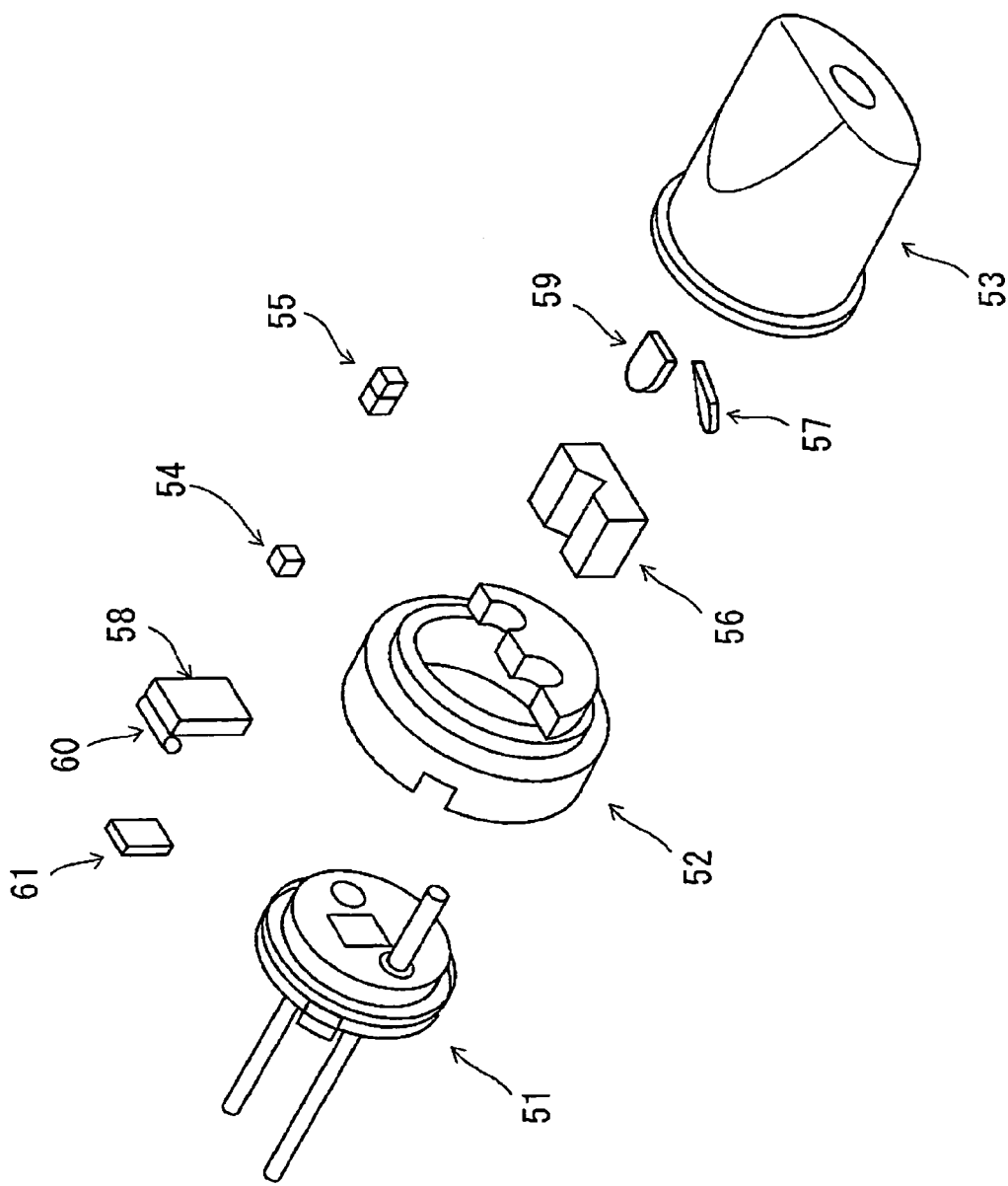
FIG. 9 is an exploded perspective view showing the configuration of the laser emitting module according to the second embodiment of the present invention.

The laser emitting module according to the present embodiment of the present invention will be described by referring to FIGS. 8 and 9. FIG. 8 is a schematic cross-sectional view thereof, and FIG. 9 is an exploded perspective view thereof. A laser emitting module 5 has an external configuration formed from a header 51 to which a laser diode will be attached, a heat sink 52 for conducting and dissipating heat to the outside, and a window cap 53 for protecting the inside the module. Within the window cap 53, there are accommodated a laser diode 54 for emitting a light for exciting a solid-state laser medium, an optical resonator 55 for converting a wavelength of the laser beam, a base member 56 for securing the optical resonator 55 thereon, optical filters 57, 58 for selecting a wavelength of the laser beam, a reflector mirror 59 for reflecting a split laser beam toward the photodiode, a spacer 60 for keeping a space between the photodiode and the optical filter 58, and a photodiode 61 for converting an intensity of the laser beam to an electrical signal.

The header 51 is an approximately disk-shaped member and has an external appearance such that two disks having a different diameter are jointed together. A disk thereof having a smaller diameter is disposed so as to face the inside the laser emitting module 5 and fit into the heat sink 52 adjacent thereto. Contact portions between the heat sink 52 and the header 51 are jointed air tight thereby preventing air flow therethrough. An external terminal 62 and an inner terminal 63 formed in the header 51 are electrically connected thereby allowing to supply a current from the outside to inside the laser emitting module 5.

Likewise in the previous embodiment of the present invention described above, the heat sink 52 according to the present embodiment is a member having a flange-shaped portion 52a and a seating portion 52b formed as a single unit. The heat sink 52 is disposed in contact with a base member 56 which supports an optical resonator 55, and with a laser diode 54, for conducting and dissipating heats generated by the laser diode 54 and the optical resonator 55, and is formed using a metal having a high thermal conductivity, such as copper or the like.

An outer diameter of the flange-shaped portion 52a defines a maximum diameter of the laser emitting module 5, and the outer periphery thereof is exposed outside the surface of the module. An inner diameter of the flange-shaped portion 52a corresponds to a size of the header 51, and the header 51 is fit into the flange portion 52a securing air tightness at the contact portions therebetween. The seating portion 52b has a half cylinder form split apart along the center axis thereof, and is formed to cover a bottom half portion of the flange-shaped portion 52a as shown in the drawing. Further, on the seating portion 52b, the laser diode 54 is supported at a position along the center axis of the window cap 53. The seating portion 52b, when the window cap 53 is attached to the heat sink 52, is accommodated within the window cap 53.

The window cap 53 is a member having a shape with an approximately cylindrical side wall 53d, an obliquely open window plane 53a formed obliquely relative to the center axis of the cylinder, and an oblique side plane 53c. One end of the window cap 53 on the side of the heat sink 52 is open. On the other end thereof, i.e., opposite to the heat sink 52, the obliquely open window plane 53a is formed obliquely relative to the center axis of the side wall 53d. In the obliquely open window plane 53a, a window section (port) 53b is opened. Further, a portion of the side wall 53d is bent toward the center axis thereof so as to provide the oblique side plane 53c slanting relative to the center axis. The oblique window plane 53a and the oblique side plane 53c are formed to make an L-shaped crossing. However, its angle of crossing therebetween is not necessarily right angle. Further, the angle of these crossing two planes is arranged to hold a positional and an angular relationships, as will be described later, in such a way that a split laser beam reflected on an optical filter 57 formed on the oblique window plane 53a is further reflected on a reflection mirror 59 formed on the oblique side plane 53c so as to be directed to a photodiode 61.

A side wall diameter of the window cap 53 is large enough to accommodate the seating portion 52b of the heat sink 52, and accommodate, as will be described later, an optical resonator 55, a base member 56, optical filters 57, 58, a reflection mirror 59, a spacer 60 and a photodiode 61 therein. With reference to FIG. 8, because the heat sink 52 and the base member 56 are distributed unevenly and disposed mainly in the lower portion within the window cap 53, the upper portion in the window cap 53 is sparsely distributed so as to secure a space.

The open side of the window cap 53 is jointed to the flange-shaped portion 52a of the heat sink 52, and joint portions therebetween are secured air tightness. Although various jointing methods are applicable, its air tightness may be secured by applying nickel plating on the surface of the heat sink 52 and jointing the window cap 53 and the heat sink 52 using a predetermined welding method.

A window section 53b is an aperture formed in the oblique window plane 53a of the window cap 53, and functions as a light output port for externally outputting a laser beam generated in the laser emitting module 5. The window section 53b which is the output port of the laser beam is formed on a light path of the laser beam to be emitted out of the module, and is positioned approximately in the center of the oblique window plane 53a of the window cap 53. Although the window port 53b is shown to be approximately a circular opening, the shape of which is not limited thereto, and any shape may be used as long as it allows an output laser beam to pass through. A size of the window port 53b is not limited specifically, and thus any size may be used as long as it allows an output laser beam from the module to pass. Further, an optical filter 57 is attached to the window port 53b for providing air tightness as will be described later.

The window cap 53, because it is provided for protection of respective components accommodated therein, preferably has rigidity to withstand a mechanical shock and/or pressure likely to be applied during handling of typical electronic parts. Further, because it is jointed with the heat sink 52, in order efficiently to dissipate heat conducted through the heat sink 52 out of the module, it is desirable to be made of a material having a high thermal conductivity. Still further, in order to limit the output path of the laser beam generated in the laser emitting module 5 only to the window port 53b, it is desirable to have a light shielding property.

A laser diode 54 is a semiconductor laser element such as of gallium aluminum arsenide (GaAlAs), which generates a laser beam of a predetermined wavelength when applied a voltage. The laser element used in the present embodiment of the present invention generates a laser beam of 808 nm wavelength. The laser diode 54 is disposed in contact with the seating portion 52b of the heat sink 52. In this case, a laser emitting plane of the laser diode 54 is disposed facing toward the window aperture 53b formed in the window cap 53, and in the vicinity of the edge of the seating portion 52b on the side facing the window aperture 53b in order to minimize a distance to the optical resonator 55.

The laser diode 54 is electrically connected to an inner terminal 63, although not shown in the, and generates a laser beam of 808 nm wavelength in accordance with a voltage applied to an external terminal 62 which is in contact with the inner terminal 63. The laser diode 54 conducts heat generated during its laser oscillation to the heat sink 52, and dissipates the heat out of the module via the heat sink. Accordingly, it is necessary to bond between the laser diode 54 and the seating portion 52b of the heat sink 52 with adhesive having a high thermal conductivity, preferably silver paste or the like.

An optical resonator 55 which is a device member for converting the wavelength of a laser beam generated in the laser diode 54 and producing a laser beam of a different wavelength has such a structure in which a solid-state laser medium 55a and a non-linear optical element 55b are joined, and are sandwiched between dichroic coatings which reflect a light of a predetermined wavelength. The optical resonator 55 is supported by the base member 56, and the solid state laser medium 55a thereof is disposed next to the laser diode 54 and the non-linear optical element 55b thereof is disposed on the center axis of the window cap 53 on the side facing the window aperture 53b. In this case, the optical resonator 55 and the laser diode 54 are disposed without contacting but with a gap of several μm.

The mechanism of the optical resonator 55 for converting the wavelength of an incident laser beam and emitting a laser beam of a different wavelength is known as the second harmonic generation (SHG). In the present embodiment, Nd:YVO$_4$ is used as the solid-state laser medium, and potassium titanate phosphate (KTiOPO$_4$, herein after referred to as KTP) is used as the non-linear optical element, however, they are not limited thereto, and its optical resonator 55 may be constituted using any other appropriate materials. When the laser beam of 808 nm wavelength generated in the laser diode 54 enters the solid-state laser medium 55a, it excites the electronic state of the solid-state laser medium 55a so as to generate a laser beam of 1064 nm wavelength. The laser beam of 1064 nm wavelength emitted from the solid-state laser medium 55a enters the non-linear optical element 55b for further conversion of its wavelength, then, finally, a laser beam of 532 nm wavelength is emitted from the optical resonator 55.

A laser beam emitted from the laser diode 54 has a wide spread angle, thereby the laser beam of 808 nm wavelength outputted from the laser diode 54 decreases its energy density per unit area substantially until it reaches the solid-state laser medium 55a because of its widely spreading optical radius. Therefore, it is important to minimize a gap between the light emitting plane of the laser diode 54 and a front plane of the solid-state laser medium 55a so as to be able to improve efficiency for excitation of the laser beam of 1064 nm wavelength in the solid-state laser medium 55a.

The base member 56 is a member for securing the optical resonator 55 thereon and conducting the heat generated in the optical resonator 55 to the heat sink 52. Accordingly, it is preferable for the base member 56 to be formed using a material having a high thermal conductivity, for example, copper or the like. The base member 56 has a rectangular shape having a groove 56a formed therein, into which the optical resonator 55 is inset, and is disposed in contact with the seating portion 52b of the heat sink 52. Accordingly, it becomes possible to conduct the heat generated in the optical resonator 55 to the heat sink 52 and also juxtapose the laser diode 54 mounted on the seating portion 52b and the optical resonator 55 to each other.

In order efficiently to conduct the heat generated in the optical resonator 55 to the base member 56, it is preferable to use an adhesive having a high thermal conductivity, for example, such as silver paste, for jointing the optical resonator 55 and the base member 56. It is also preferable to use an adhesive having a high thermal conductivity such as silver paste for jointing the base member 56 and the heat sink 52. Alternatively, the heat sink 52 and the base member 56 may be formed as a single unit using the same material.

An optical filter 57 is a flat plane member having approximately a similar form as the oblique window plane 53a, and is disposed in close contact with the oblique window plane 53a so as to secure air tightness at the window section 53b. In order to secure air tightness at the window section 53b, an outer diameter of the optical filter 57 is larger than the aperture of the window section 53b, so the oblique window plane 53a of the window cap 53 and the optical filter 57 are jointed air proof. The oblique window plane 53a is formed slanting relative to the center axis of the sidewall of the window cap 53, accordingly, the optical filter 57 is also disposed slanting relative to the center axis thereof as well as slanting relative to a direction of progression of the laser beam emitted from the optical resonator 55. By this oblique arrangement of the optical filter 57 relative to the center axis that is a main direction of progression of the laser beam, a part of the laser beam emitted from the optical resonator 55 is reflected on the optical filter 57 toward a reflection mirror 59.

The optical filter 57 is made of a material having an optical property that absorbs a light of a predetermined wavelength. The material of the optical filter 57 according to the present embodiment is selected to be such one that can efficiently reflect and/or absorb the laser beams of 808 nm wavelength emitted from the laser diode 54 as well as of 1064 nm wavelength emitted from the solid-state laser medium 55a, and can transmit the laser beam of 532 nm wavelength converted in the non-linear optical element 55b. Because that the optical filter 57 absorbs the laser beams of 808 nm as well as 1064 nm wavelengths, a laser beam that can be outputted from the window cap 53 through the window aperture 53b is ensured to be a green laser beam of 532 nm wavelength.

The laser beam outputted from the optical resonator 55 and incident on the optical filter 57 is partially reflected on the surface of the optical filter 57 due to a difference in refractive indexes between air and the optical filter 57. The laser beam reflected on the surface of the optical filter 57 is directed toward the oblique side plane 53c and to be incident on a reflection mirror 59 to be described later. A ratio of the laser beam reflected on the surface of the optical filter 57 is determined by a refractive index of the optical filter 57 and a surface condition thereof. Typically, it is about 7% of light is reflected. Further, because another 7% of the laser beam is reflected on a rear surface of the filter 57 when coming out of the optical filter into air, the total of about 14% of laser beam is reflected toward the reflection mirror 59. It is also possible to increase or decrease the ratio of the laser beam to be reflected by applying a coating on the surface of the optical filter 57. Alternatively, as its optical filter 57, a light transmitting material such as a glass with a dielectric material formed thereon that selects a wavelength of light to be transmitted may be used.

The reflection mirror 59 is a member having approximately the same form as that of the oblique side plane 53c, and functions as a mirror for reflecting a light incident thereon. Because the reflection mirror 59 is formed on the oblique side plane 53c, the reflection mirror 59 is disposed obliquely relative to the center axis of the window cap 53. The reflection mirror 59 may be formed by attaching it to the surface of the oblique side plane 53c or directly mirror-finishing the surface of the oblique side plane 53c. By provisions of the optical filter 57 on the oblique window plane 53a and the reflection mirror 59 on the oblique side plane 53c, and due to an appropriate angular relationship between the oblique window plane 53a and the oblique side plane 53c, a portion of the laser beam reflected on the optical filter 57 is further reflected on the reflection mirror 59 and directed toward a photodiode 61 to be described later.

An optical filter 58 is a member having an optical property for absorbing a light of a predetermined wavelength, and is disposed on a path of the light reflected on the reflection mirror 59 to the photodiode 61. A material of the optical filter 58 according to the present embodiment is selected to be such one that can efficiently absorb the light of 808 nm wavelength emitted from the laser diode 54 and the light of 1064 nm wavelength emitted from the solid-state laser medium 55a but transmit the light of 532 nm wavelength converted in the non-linear optical element 55b. Because the optical filter 57 absorbs the light of 808 nm and 1064 nm wavelengths, out of the laser beams reflected on the surface of the optical filter 57 and the reflection mirror 59, only a green laser beam of 532 wavelengths is allowed to enter the photodiode 61. Instead of disposing the optical filter 58 in front of the light receiving surface of the photodiode 61 for selecting a wavelength of light to be received. Alternatively, a dielectric coating may be applied on the receiving surface of the photodiode 61 for selecting the wavelength of light.

A spacer 60 is a cylindrical member attached between the photodiode 61 and the optical filter 58 for providing a space therebetween. The spacer 60 holds the optical filter 58 and secures the space therebetween for electrical wirings.

The photodiode 61 is an optical member for converting an incident light arriving at the light receiving plane thereof into an electric signal in accordance with an intensity of the light. The photodiode 61 is connected via an electric wiring (not shown) to the inner terminal 63, and the electric signal converted in accordance with the intensity of the light is transmitted to the external terminal 62 therethrough. The light received by the photodiode 61 is a part of the light emitted from the optical resonator 55, which is reflected on the surfaces of the optical filter 57, further reflected on the reflection mirror 59, and transmitted through the optical filter 58. The photodiode 61 is supported by the header 51 and placed at an appropriate position suited to receive the light passing through the optical filter 58. Because the light received at the photodiode 61 is a part of the light emitted from the optical resonator 55, it is possible to calculate and obtain the intensity of the light emitted through the window port 53b from the intensity of the light received at the photodiode 61.

By disposing the photodiode 61 on the header 51, electrical connection between the inner terminal 63 and the photodiode 61 becomes easier, and because that the photodiode 61 is placed on the rear side of the laser diode 54, a compacter-sized laser emitting module 5 is obtained.

When packaging respective elements and components within the window cap 53, its assembly is done in a clean and dry environment such as in a clean room. During assembly, because the air tightness between the window port 53b of the window cap 53 and the optical filter 57, between the window cap 53 and the heat sink 52 as well as between the heat sink 52 and the header 51 are secured, inside the laser emitting module 5 is completely hermetically sealed. By filling inside the module with a dry air having a dew point of about −40° C., dust-proof and/or dew condensation prevention for the laser diode 54 and the optical resonator 55 disposed inside the module can be achieved. Accordingly, a prolonged service life, a reduced rate of failure, and an improvement in yields of the laser diode 54 and the optical resonator 55 can be achieved, thereby improving the reliability of the laser emitting module 5. In place of the dry air, an inert gas such as nitrogen may be filled as well.

Figure 10:
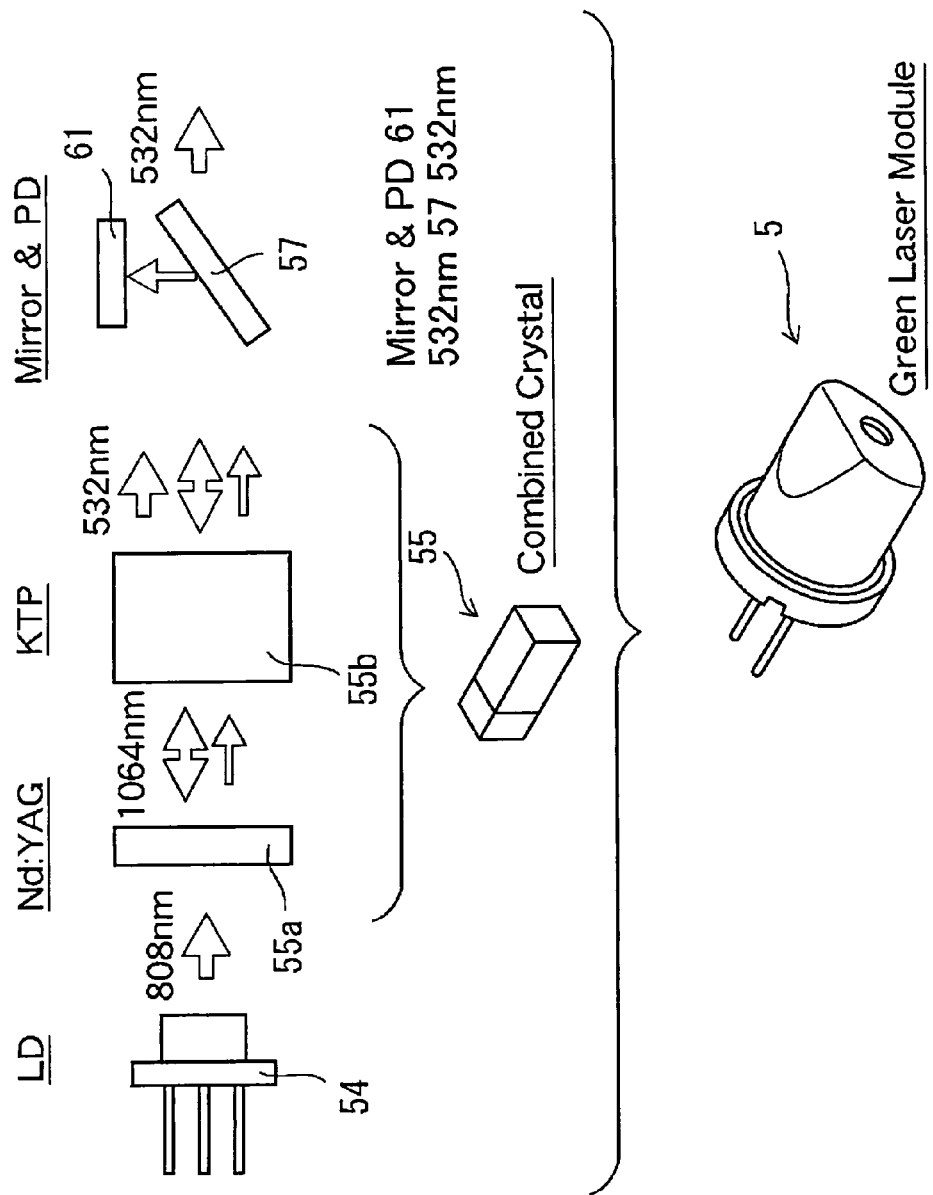
FIG. 10 is a schematic diagram showing conversions of wavelengths of light performed on the basis of SHG in the laser emitting module according to the second embodiment of the present invention, with reference to wavelengths obtained at respective elements.

FIG. 10 is a schematic diagram showing changes in wavelengths of laser beams effected between respective members within the laser emitting module 5. When a laser beam of 808 nm wavelength generated in the laser diode 54 passes through the solid-state laser medium 55a, a laser beam of 1064 nm wavelength is excited. In this case, a part of the light of 808 nm wavelength emitted from the laser diode 54 remains unconverted, thereby allowing for two different rays of light with a different wavelength to reach the non-linear optical element 55b. In the non-linear optical element 55b, although a part of the light of 1064 nm wavelength is converted to a light of 532 nm wavelength, both lights of 1064 nm and 808 nm wavelengths as well as the light of 532 nm wavelength are emitted from the optical resonator 55.

The three different beams of light having a different wavelength emitted from the optical resonator 55 are reflected partially on the surface of the optical filter 57 to reach the photodiode 61. As for the main laser beams, when passing through the optical filter 57, those of 1064 nm and 808 nm wavelengths are absorbed thereby allowing only a laser beam of 532 nm wavelength to be outputted from the laser emitting module 5.

Figure 11:
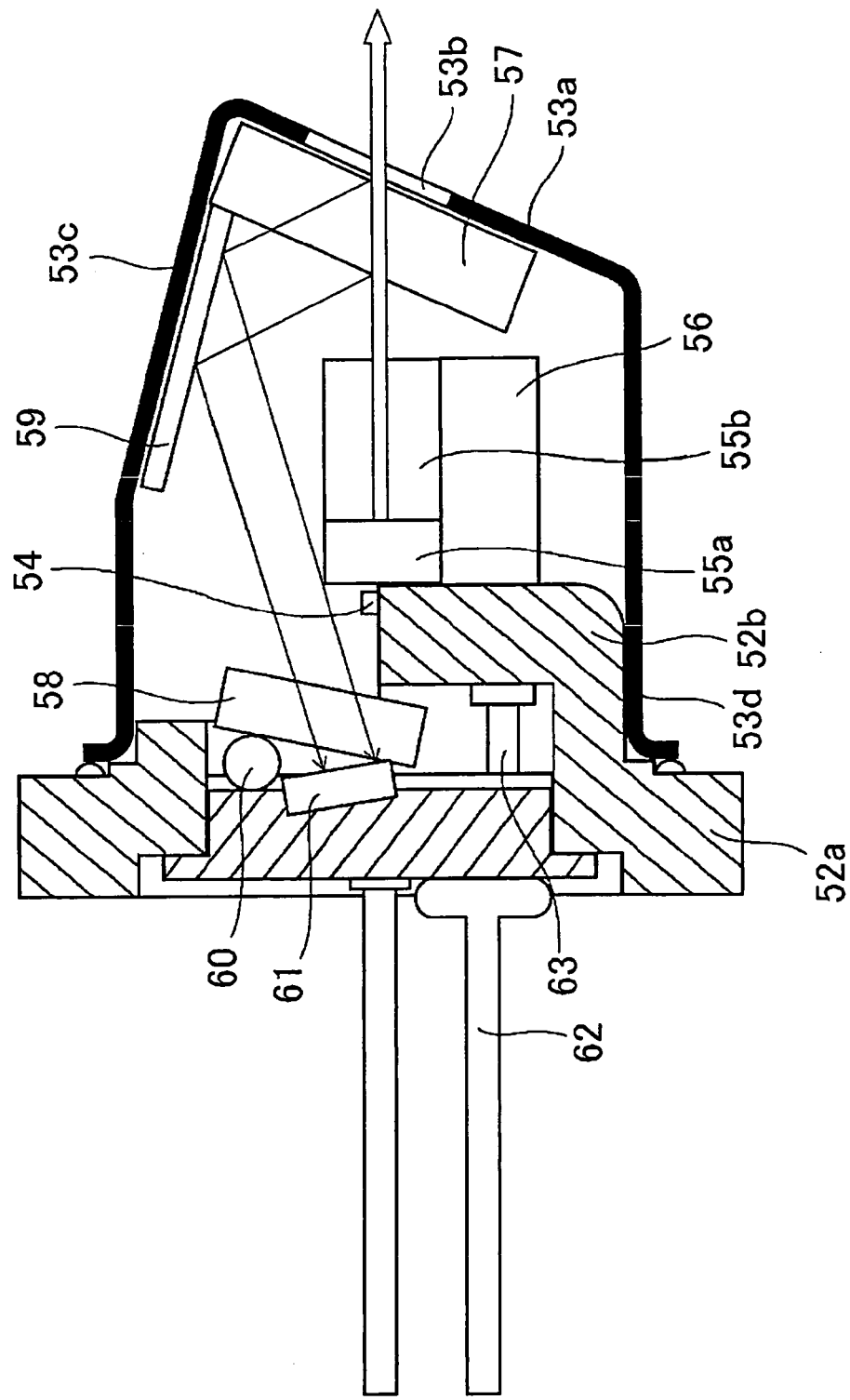
FIG. 11 is a schematic diagram showing optical paths in the laser emitting module according to the second embodiment of the invention.

FIG. 11 is a schematic diagram showing optical paths of laser beams within the laser emitting module 5. A main path of a laser beam which is emitted from the laser diode 54, the wavelength of which is converted in the optical resonator 55 by the SHG, and emitted out of the laser emitting module 5 through the window port 53b as well as paths of laser beams which are reflected on the optical filter 57 and reach the photodiode 61 are indicated by arrows.

Laser beams emitted from the optical resonator 55 include, as described with reference to FIG. 10, three kinds of beams of 808 nm, 1064 nm and 532 nm wavelengths. The laser beams emitted from the optical resonator 55 progress along the center axis of the window cap 53 to enter the optical filter 57. At this instant, due to a difference in refractive indexes between the optical filter 57 and air as described above a part of the beams is reflected toward the reflection mirror 59. Therefore, the three kinds of beams with different wavelengths are partially reflected on the optical filter 57, then reflected also on the reflection mirror 59, and proceed to the direction of the photodiode 61. In front of the light receiving surface of the photodiode 61 is disposed the optical filter 58, thereby the beams of 808 nm and 1064 nm wavelengths out of the three different kinds of beams are absorbed in the optical filter 58, allowing only the beam of light of 532 nm wavelength to reach the photodiode 61.

Further, a part of the light having passed the optical filter 57 is reflected also on the rear surface of the optical filter 57 facing the ambient air toward the reflection mirror 59, to be reflected thereon, then to pass through the optical filter 58 finally to reach the photodiode 61. As this laser beam having passed the optical filters 57 and 58, the laser beam arriving at the photodiode 61 is only a light having 532 nm wavelength. In the window cap 53, because the seating portion 52b of the heat sink 52, the base member and the like are unevenly distributed, i.e., mainly in the lower portion as shown in the drawing, an enough spatial portion is secured in the upper portion. Therefore, even if the photodiode 61 is disposed on the header 51, the light reflected on the reflection mirror 59 is allowed to reach the photodiode 61 propagating through the spatial portion.

Further, the light outputted from the laser emitting module by passing through the optical filter 57 and the window port 53b is limited to the light of 532 nm wavelength because the other beams of 808 nm and 1064 nm wavelengths are absorbed in the optical filter 57. A ratio of the light reflected on the optical filter 57 is determined by the material and a surface condition of the optical filter 57, accordingly, an intensity of the light outputted from the window port 53b can be calculated by detecting an intensity of the light received by the photodiode 61.

In case an angle formed between the main direction of progression of the light and the oblique window plane 53a becomes nearly perpendicular, an angle formed between the main direction of progression of the light and the optical filter 57 becomes nearly perpendicular, thereby allowing for a part of the light reflected on the optical filter 57 to return to the optical resonator 55, then returns to the optical filter 57 as reflected thereon, thus reciprocating therebetween. For these multi-reflected laser beams having multi paths, after passing through the optical filter 57 and emitted from the window port 53b as a laser beam from the laser emitting module 5, its laser beam indicates multi points resulting from the multi paths. Accordingly, by arranging such that the reflection light from the optical filter 57 does not return to the optical resonator 55 by adjustment of the angle between the main direction of progression of the light and the oblique window plane 53a, advantageously, it becomes possible to prevent the occurrence of the multi-reflection between the optical filter 57 and the optical resonator 55, and to thereby confine the laser beam to be outputted from the window port 53b only at a single point.

The light of 532 nm wavelength is recognized as a green light by the human eyes, and as it has a higher relative visibility than a red or near infrared laser beam, it demonstrates a better visibility than the red laser beam when they are output at same output levels. Therefore, it becomes possible to provide the better visibility even if its output power is reduced in order to minimize the risk of harm to the human body.

For the wavelength conversion on the basis of the SHG shown in FIG. 10, because performance of all of the laser diode 54, the solid-state laser medium 55a and the non-linear optical element 55b depend on their operating temperatures, in particular, with respect to their emission characteristics and wavelength conversion properties, it is desirable for their ambient temperature changes to be minimal. For example, in the case where $Nd:YVO_4$ is used as the solid-state laser medium 55a, a preferable range of wavelengths for efficiently exciting the solid-state laser medium 55a is 808.6±2.0 nm. However, if its ambient temperature changes by about 10° C., the wavelength of light from the laser diode 54 will change about 3 nm. Further, as a crystal of the solid-state laser medium 55a is sliced assuming its operating temperature to be about 25° C., if its operating temperature change is substantial, its emission efficiency at shorter wavelengths will decrease.

According to the present embodiment, as described with reference to FIG. 8, the laser diode 54 is jointed to the heat sink 52 with the solder having the high thermal conductivity, and the optical resonator 55 is jointed to the base member 56 with the adhesive having the high thermal conductivity. Further, the heat sink 52 and the base member 56 are also formed using the metal having the high thermal conductivity, and because the heat sink 2 is exposed out of the surface of the laser emitting module 5, the heat generated in the laser diode 54 and the optical resonator 55 is efficiently dissipated externally via the base member 56 and the heat sink 52. Therefore, advantageously according to the laser emitting module 5 of the present invention, it is enabled to stabilize the operating ambient temperatures of the laser diode 54 as well as the optical resonator 55, to finally emit the laser beam of 532 nm wavelength efficiently with a stable output power.

Figure 12:
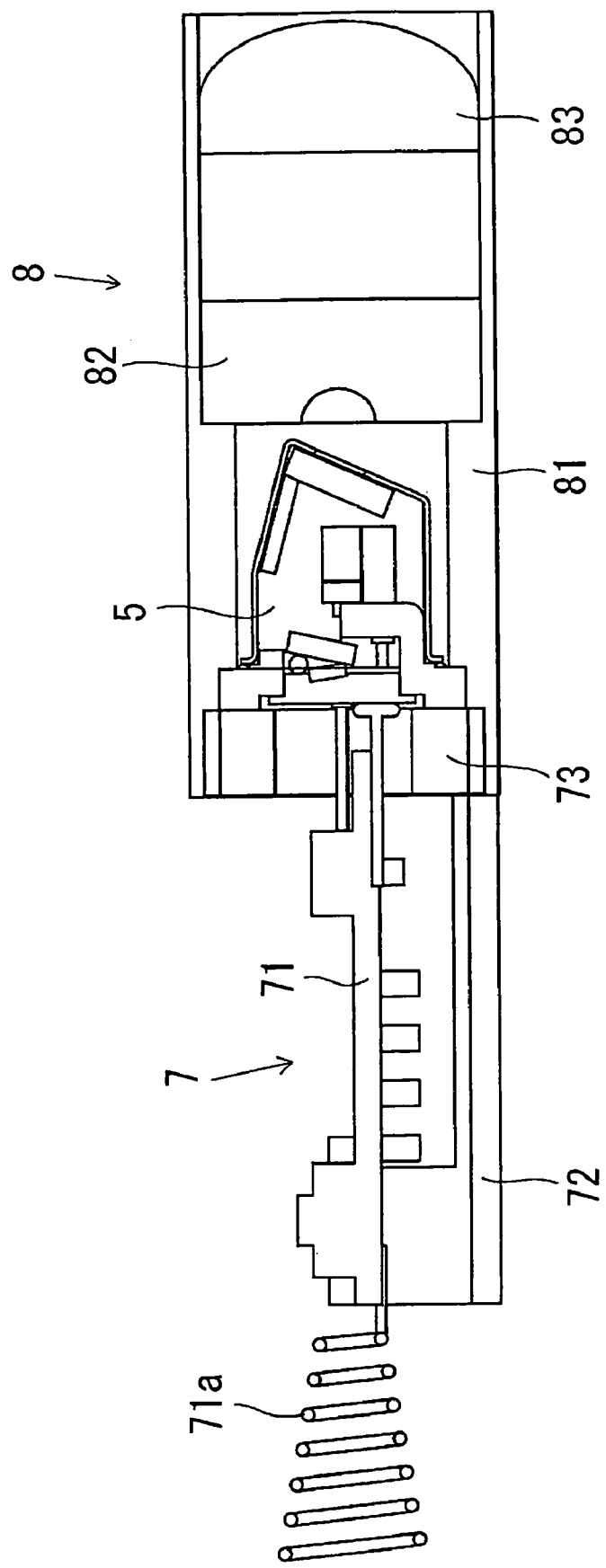
FIG. 12 is a cross-sectional view showing a configuration of a laser pointer using the laser emitting module according to the second embodiment of the present invention.
Figure 13:
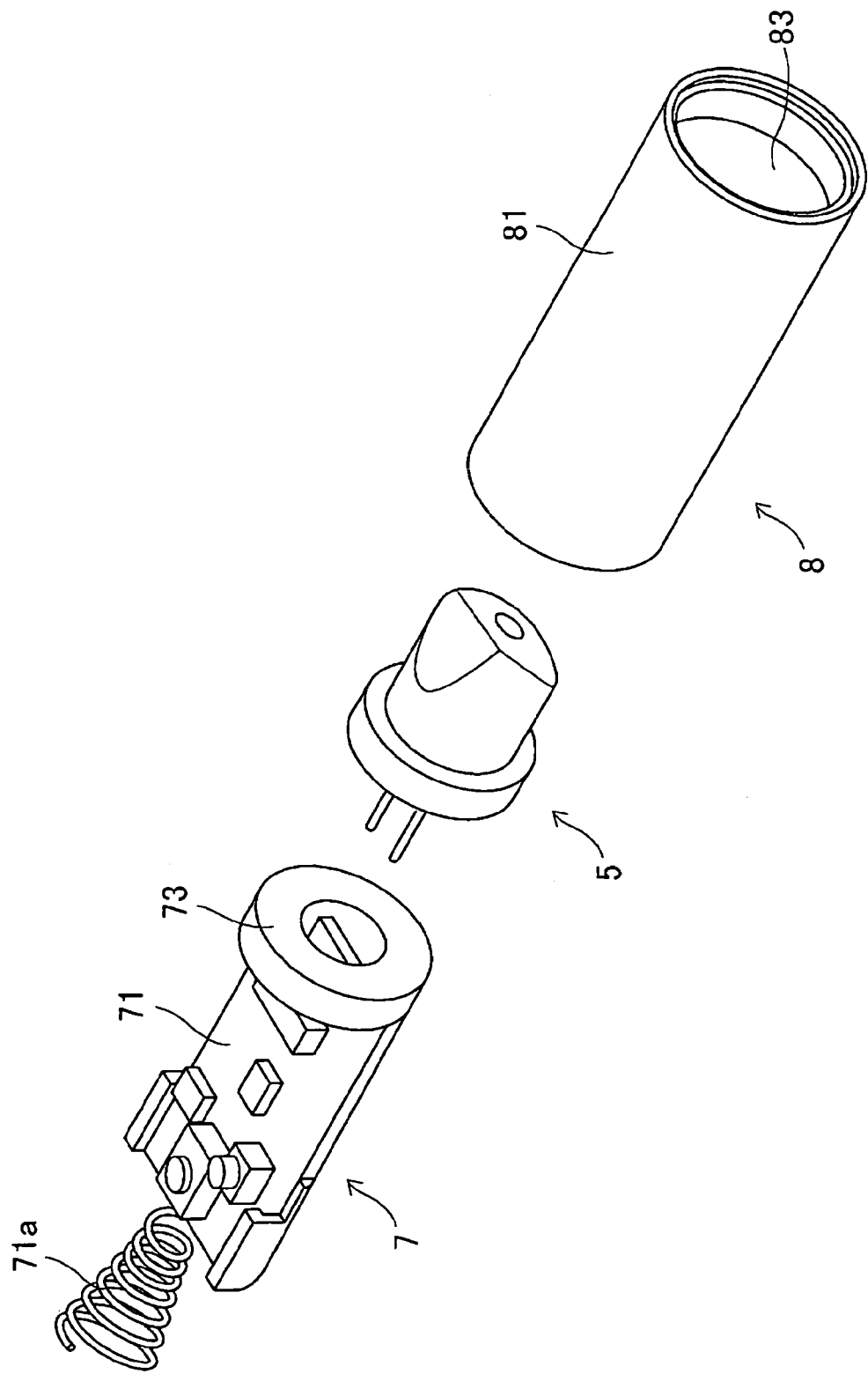
FIG. 13 is an exploded perspective view showing a configuration of the laser pointer using the laser emitting module according to the second embodiment of the invention.

Now, by referring to FIGS. 12 to 15, a laser pointer using the aforementioned laser emitting module 5 will be described. FIG. 12 is a schematic cross-sectional view of the laser pointer, and FIG. 13 is an exploded perspective view thereof. As shown in FIG. 13, the laser pointer includes the laser emitting module 5, a driver section 7 and a lens assembly section 8.

Figure 14:
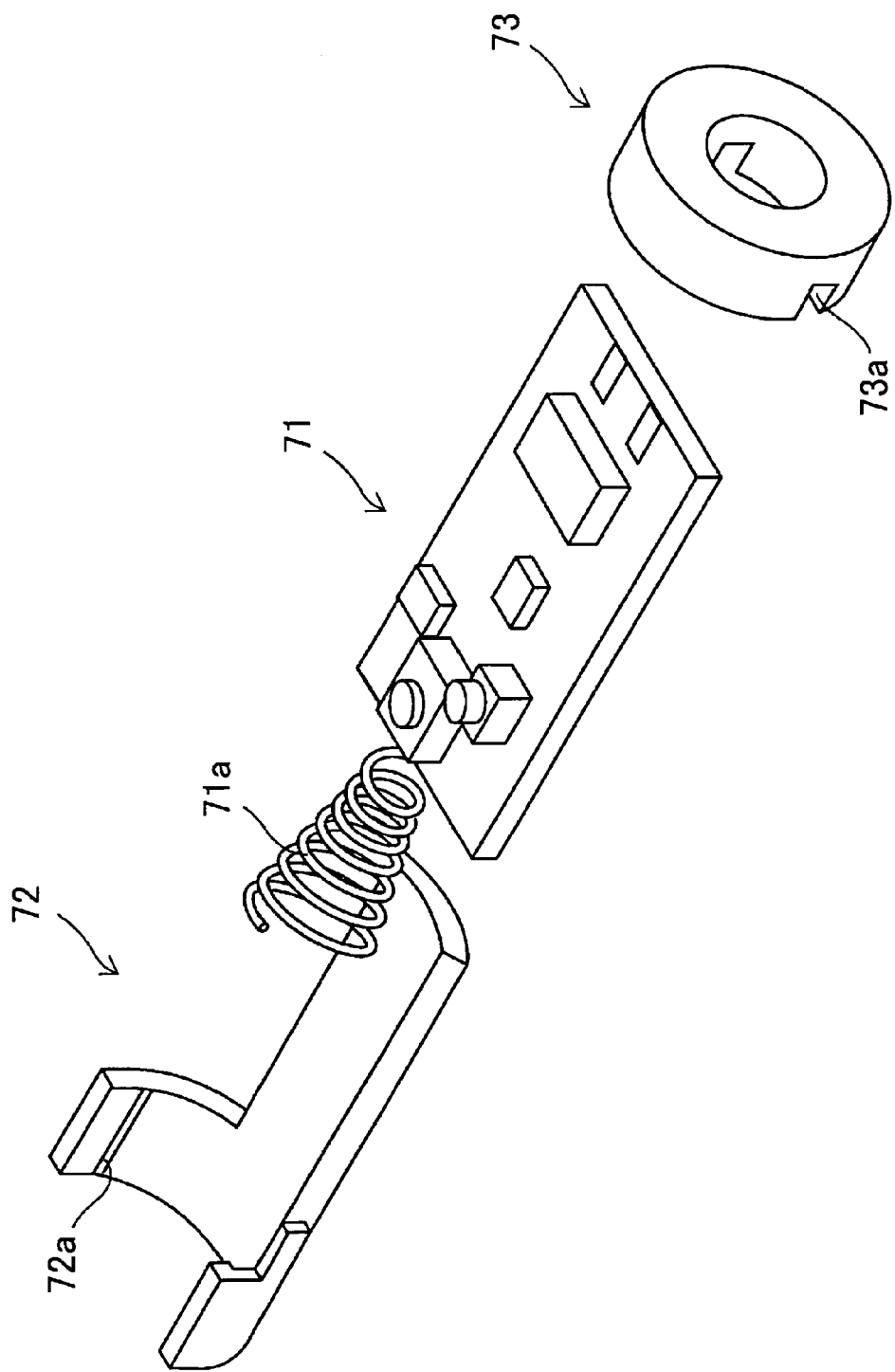
FIG. 14 is an exploded perspective view showing a configuration of a driver section thereof.

The driver section 7 which is electrically connected to the laser emitting module 5 is a member for applying a voltage to the laser emitting module 5 and controlling the light emission therefrom. As shown in FIG. 14, the driver section 7 includes a circuit board 71, a driver holder 72 and a light emitting module holder 73.

The circuit board 71 on which electrical circuits are formed is connected to an external terminal 62 of the laser emitting module 5. The electrical circuit formed on the circuit board 71 includes, for example, an auto power control (APC). A power supply wiring 71a of a spring type made of a conducting material is connected to the circuit board 71. By connecting a power supply such as a battery to the power supply wiring 71a, a current is supplied to the circuit board 71 for driving the same.

A part of the laser beam generated and emitted from the optical resonator 55 is reflected on the optical filter 57 and the reflection mirror 59, then the photodiode 61 detects an intensity of the reflected light. The reflected light detected is converted to an electrical signal by the photodiode 61, and the electrical signal indicating the intensity of the reflected light is transmitted via the internal and the external terminals 63, 62 to the circuit board 71. In the circuit board 71, an intensity of a laser beam emitted from the window port 53b is calculated on the basis of the electric signal from the photodiode 61, and a voltage to be supplied from the power source is adjusted so as to control the intensity of the laser beam generated in the laser emitting module 5. Because in the circuit board 71 the intensity of laser emission from the laser emitting module 5 is controlled using the APC circuit, it is ensured to limit the intensity of a laser beam outputted from the laser pointer to or less than a predetermined value, and continue the emission of the laser beam stably at an output level less harmful to the human body.

The driver holder 72 which constitutes an external structure of the driver section 7 is a member for securing the circuit board 71 and the light emitting module holder 73. The driver holder 72, which has a groove 72a formed therein into which a substrate of the circuit board 71 is inserted and held firmly, serves as a casing therefor. The light emitting module holder 73 which is supported by the driver holder 72 and to the circuit board 71 is a member for holding the laser emitting module 5 and the circuit board 71 together in electrical contact. With the substrate of the circuit board 71 fit into a groove 73a formed in the light emitting module holder 73 and with the laser emitting module 5 attached thereto on the opposite side of the circuit board 71, the light emitting module holder 73 is accommodated into a lens holder section 8.

Figure 15:
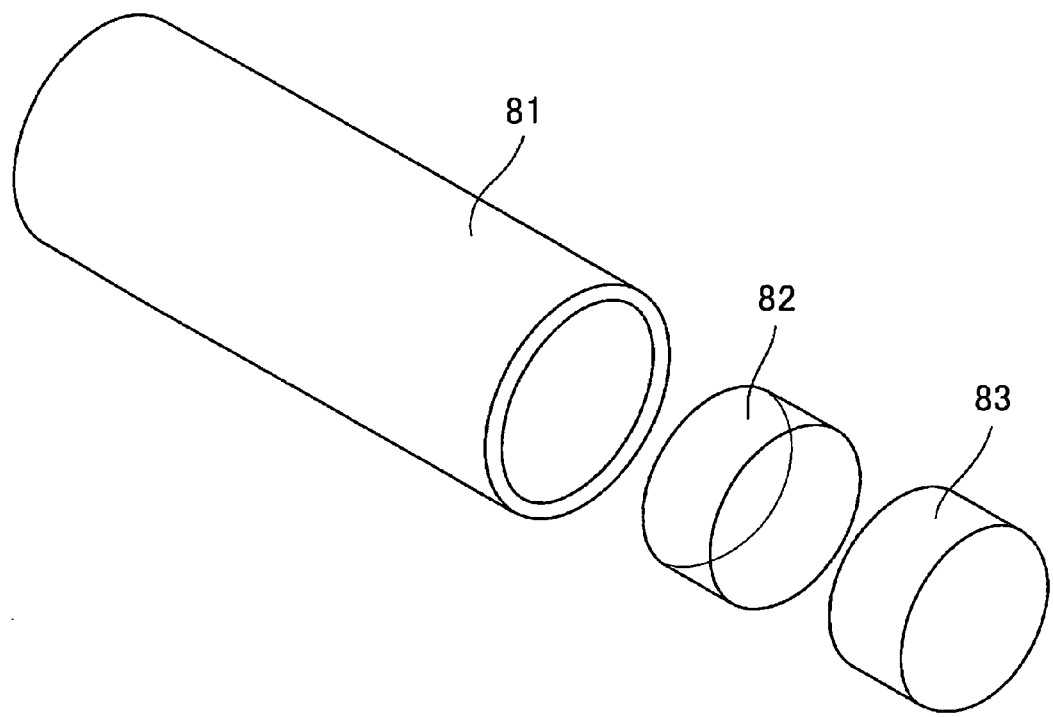
FIG. 15 is an exploded perspective view showing a configuration of a lens section thereof.

The lens holder section 8 functions as a collimator lens for collimating the laser beams emitted from the laser emitting module 5 into parallel rays of light. The lens holder section 8 includes a lens holder 81, a concave lens 81 and a convex lens 83, as shown in FIG. 15.

The lens holder 8 is approximately of a cylindrical shape, and has an inner diameter approximately same to the sizes of the laser emitting module 5, the module holder 73, the convex and concave lenses 82, 83. Within the lens holder 81, the laser emitting module 5, the emitting module holder 73, the concave and convex lenses 82, 83 are disposed and fixed, wherein the concave and convex lenses 82, 83 are held in parallel at a predetermined distance.

The lens holder 81 is formed of a material having a high thermal conductivity, for example, such as copper, and when securing the laser emitting module 5 inside the lens holder 81, the heat sink 52 and the lens holder 81 are jointed using an adhesive having a high thermal conductivity. Accordingly, the heat generated by the laser diode 54 and the optical resonator 55 in the laser emitting module 5 is conducted via the heat sink 52 to the lens holder 81 to be efficiently dissipated therefrom. By performing the efficient heat dissipation from the laser diode 54 and the optical resonator 55 as described above, and stabilizing the ambient temperatures of the laser diode 54 and the optical resonator 55, it becomes possible to improve the efficiency of emission of the laser beam and continue a stable output of the laser beam without use of a complicated system for controlling ambient temperatures, thereby reducing the number of components and thus the production cost.

The concave lens 82 and the convex lens 83 in combination function as a collimator lens, wherein the concave lens 82 expands an optical radius of the laser beam emitted from the laser emitting module 5 and the convex lens 83 collimates into parallel rays of light. As it is enabled to expand an area to be illuminated with the light emitted from the laser emitting module 5 as well as to collimate into the parallel rays of light, by use of this laser pointer, a remote object can be illuminated with the laser beam having a predetermined radius.

It should be understood by those skilled in the art that various modifications, combinations, sub-combinations and alterations may occur depending on design requirements and other factors insofar as they are within the scope of the appended claims or the equivalents thereof.

What is claimed is:

1. A window cap for accommodating a laser oscillation device for emitting a laser beam, wherein:
    a window section is formed for outputting a laser beam,
    a plane, in which the window section is formed, forms an obliquely open window section which is non-perpendicular with respect to a main direction of progression of the laser beam, and
    a part of a side plane of the window cap forms an oblique side plane which is non-parallel with respect to the main direction of progression of the laser beam.

2. The window cap of a laser emitting module according to claim 1, wherein:
    a reflecting plane is formed on an inner surface of the oblique side plane for reflecting light.

3. A laser pointer comprising:
    a resonator including a solid-state laser medium, a non-linear optical element for converting a wavelength of light emitted from the solid-state laser medium, and a pair of resonance reflectors sandwiching the solid-state laser medium and the non-linear optical element for reciprocating the light therebetween;
    a laser diode for emitting light for exciting the solid-state laser medium;
    a window cap having a window section through which the light emitted from the resonator is outputted, for accommodating the resonator and the laser diode therein;
    an optical filter for selecting a wavelength of an output light emitted from the resonator; and
    a pair of convex and concave lenses for expanding and collimating light emitted from the window section into parallel rays of light.

4. The laser pointer according to claim 3, further comprising:
    a driver circuit connected to the laser diode for controlling light emission of the laser diode.

5. The laser pointer according to claim 4, wherein:
    the driver circuit comprises an automatic current control circuit.

6. The laser pointer according to claim 4, further comprising:
    a split reflector for reflecting a part of a light emitted from the resonator, and
    a received photo detector for detecting a light reflected from the split reflector,
    wherein the split reflector and received photo detector are accommodated within the window cap.

7. The laser pointer according to claim 6, further comprising:
    a driver circuit connected to the laser diode for controlling light emission of the laser diode in accordance with a light intensity detected by the received photo detector.

8. A laser pointer comprising:

a resonator including a solid-state laser medium, a non-linear optical element for converting a wavelength of light emitted from the solid-state laser medium, and a pair of resonance reflectors sandwiching the solid-state laser medium and the non-linear optical element for reciprocating the light therebetween;

a laser diode for emitting light for exciting the solid-state laser medium;

a base member for supporting the resonator;

a heat sink disposed in contact with the laser diode and the base member;

an optical filter for selecting a wavelength of light emitted from the resonator; and a pair of convex and concave lenses for expanding and collimating light emitted through the optical filter into parallel rays of light.

* * * * *